(12) United States Patent
Cho et al.

(10) Patent No.: US 10,147,900 B2
(45) Date of Patent: Dec. 4, 2018

(54) METHOD FOR MANUFACTURING INTEGRATED SUBSTRATE FOR ORGANIC LIGHT EMITTING DIODE, ORGANIC LIGHT EMITTING DIODE, AND METHOD FOR MANUFACTURING ORGANIC LIGHT EMITTING DIODE

(71) Applicant: Electronics and Telecommunications Research Institute, Daejeon (KR)

(72) Inventors: Doo-Hee Cho, Daejeon (KR); Jonghee Lee, Daejeon (KR); Hyunsu Cho, Daejeon (KR); Byoung-Hwa Kwon, Daejeon (KR); Jaehyun Moon, Daejeon (KR); Young Sam Park, Daejeon (KR); Jin Wook Shin, Daejeon (KR); Byoung Gon Yu, Yeongdong-gun (KR); Jeong Ik Lee, Daejeon (KR); Hyunkoo Lee, Daejeon (KR); Jong Tae Lim, Seoul (KR); Nam Sung Cho, Daejeon (KR); Chul Woong Joo, Seoul (KR); Jun-Han Han, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 44 days.

(21) Appl. No.: 15/400,801

(22) Filed: Jan. 6, 2017

(65) Prior Publication Data
US 2017/0207410 A1 Jul. 20, 2017

(30) Foreign Application Priority Data
Jan. 20, 2016 (KR) .................. 10-2016-0007199

(51) Int. Cl.
*H01L 21/683* (2006.01)
*H01L 51/52* (2006.01)
(Continued)

(52) U.S. Cl.
CPC ...... *H01L 51/5212* (2013.01); *H01L 21/6835* (2013.01); *H01L 51/003* (2013.01);
(Continued)

(58) Field of Classification Search
CPC ............ H01L 21/6835; H01L 51/5212; H01L 51/0022
See application file for complete search history.

(56) References Cited

U.S. PATENT DOCUMENTS 8,859,309 B2 10/2014 Shin
9,445,504 B2 9/2016 Kang et al.
(Continued)

FOREIGN PATENT DOCUMENTS

KR 10-1063361 B1 9/2011
KR 10-1161301 B1 7/2012
(Continued)

OTHER PUBLICATIONS

Ki_Hun Ok et al., "Ultra-thin and smooth transparent electrode for flexible and leakage-free organic light-emitting diodes", Scientific Rerorts, Mar. 2015, pp. 1- 8, vol. 5, Article No. 9464, Springer Nature.

*Primary Examiner* — Douglas Menz

(57) ABSTRACT

Provided are a method for manufacturing an integrated substrate for an organic light emitting diode, an organic light emitting diode, and a method for manufacturing an organic light emitting diode, wherein the method for manufacturing an organic light emitting diode may include forming a sacrificial layer on a release substrate, forming a first electrode on the sacrificial layer, forming on the first electrode
(Continued)

an auxiliary electrode pattern having an opening, forming a buffer layer on the auxiliary electrode pattern and in the opening, providing a substrate on the buffer layer, removing the release substrate and the sacrificial layer to expose a first surface of the first electrode, and laminating an organic light emitting layer and a second electrode on the first surface of the first electrode.

8 Claims, 24 Drawing Sheets

(51) Int. Cl.
    *H01L 51/00*     (2006.01)
    *H01L 51/56*     (2006.01)

(52) U.S. Cl.
    CPC ...... *H01L 51/0022* (2013.01); *H01L 51/0023* (2013.01); *H01L 51/56* (2013.01)

(56) References Cited

U.S. PATENT DOCUMENTS

2014/0034364 A1    2/2014    Kang et al.
2015/0214485 A1    7/2015    Lim et al.

FOREIGN PATENT DOCUMENTS

KR    10-1191865 B1    10/2012
KR    10-1271838 B1    6/2013

METHOD FOR MANUFACTURING INTEGRATED SUBSTRATE FOR ORGANIC LIGHT EMITTING DIODE, ORGANIC LIGHT EMITTING DIODE, AND METHOD FOR MANUFACTURING ORGANIC LIGHT EMITTING DIODE

CROSS-REFERENCE TO RELATED APPLICATIONS

This U.S. non-provisional patent application claims priority under 35 U.S.C. § 119 of Korean Patent Application No. 10-2016-0007199, filed on Jan. 20, 2016, the entire contents of which are hereby incorporated by reference.

BACKGROUND

The present invention relates to an organic light emitting diode, and more particularly, to a method for manufacturing an auxiliary electrode pattern for an organic light emitting diode.

Organic light emitting diodes are self emitting diodes that emit light by electrically exciting organic light emitting materials. An organic light emitting diode includes a substrate, a cathode, an anode, and an organic light emitting layer disposed between the cathode and the anode. When a voltage is applied to the organic light emitting diode, electrons injected from the cathode and holes injected from the anode are recombined in a light emitting center of the light emitting layer to thereby generate molecular excitons. Light is emitted as molecular excitons release energy while returning to the ground state. Known excited states include singlet excited states and triplet excited states, and it is recognized that light emission can be realized through any excited state. Organic light emitting diodes have the properties of being extremely lightweight, having a fast response time, and being operated using a low voltage direct current, and the like, and are expected to be used in next generation displays.

SUMMARY

The present disclosure provides a method for manufacturing an integrated substrate for an organic light emitting diode, an organic light emitting diode, and a method for manufacturing an organic light emitting diode.

An embodiment of the inventive concept provides a method for manufacturing an integrated substrate for an organic light emitting diode, the method including forming a sacrificial layer on a release substrate; forming a first electrode on the sacrificial layer, wherein the first electrode having a first surface and a second surface which are facing each other; forming an auxiliary electrode pattern on the second surface of the first electrode, wherein the auxiliary electrode pattern has an opening; forming a transparent buffer layer on the auxiliary electrode pattern to fill the opening; providing a substrate on the transparent buffer layer; and removing the release substrate and the sacrificial layer to expose the first surface of the first electrode.

In an embodiment, forming an insulating pattern on the sacrificial layer may be further included, wherein the first electrode may extend onto the insulating pattern; and the bottom surface of the insulating pattern may be coplanar with the first surface of the first electrode.

In an embodiment, the removing the release substrate and the sacrificial layer may include removing the release substrate to expose the sacrificial layer; and etching the sacrificial layer.

In an embodiment, the forming the auxiliary electrode pattern may include providing a screen printing pattern on the first electrode, the screen printing pattern exposing the second surface of the first electrode; and applying the metal onto the second surface of the first electrode exposed by the screen printing pattern.

In an embodiment, the forming the transparent buffer layer may include coating a precursor solution onto the auxiliary electrode and in the opening, to form a precursor layer; and curing the precursor layer.

In an embodiment of the inventive concept, a method for manufacturing an organic light emitting diode includes forming a sacrificial layer on a release substrate; forming an insulating pattern on the sacrificial layer; forming on the sacrificial layer a first electrode having a first surface and a second surface which are facing each other, the first electrode extending onto the insulating pattern; forming an auxiliary electrode pattern having an opening on the first electrode, wherein the opening exposing the second surface of the first electrode; forming a buffer layer on the auxiliary electrode pattern and in the opening; providing a substrate on the buffer layer; removing the release substrate and the sacrificial layer to expose the first surface of the first electrode; forming an organic light emitting layer on the first surface of the first electrode; forming a second electrode on the organic light emitting layer; and forming a second electrode pad on the second electrode, wherein the second electrode pad overlaps the insulating pattern when viewed on a plane.

In an embodiment, the organic light emitting layer may expose the insulating pattern, the second electrode extending onto the insulating pattern.

In an embodiment, forming a first electrode pad on the first electrode may be further included.

In an embodiment, the organic light emitting layer and the second electrode may expose a portion of the first surface of the first electrode; and the first electrode pad may be disposed on the portion of the first surface of the first electrode.

In an embodiment, the forming of the auxiliary electrode pattern may be performed through a screen printing method, an offset printing method, a gravure printing method, or a nozzle printing method.

In an embodiment, the forming of the buffer layer may include applying a precursor solution onto the auxiliary electrode pattern to form a precursor layer which fills in the opening; and curing the precursor layer.

In an embodiment, the substrate may include a first region, a second region, and a third region, the first electrode and the first electrode pad overlapping the first region of the substrate, the first electrode, the organic light emitting layer, and the second electrode overlapping the second region of the substrate, and the insulating pattern, the second electrode, and the second electrode pad overlapping the third region of the substrate.

In an embodiment, the buffer layer may include a first buffer layer covering the auxiliary electrode pattern and including a light extraction layer; and a second buffer layer provided between the first buffer layer and the substrate, and a gas barrier.

In an embodiment of the inventive concept, an organic light emitting diode includes: a substrate; a buffer layer on the substrate; an auxiliary electrode pattern disposed on the buffer layer and having an opening; a first electrode disposed on the auxiliary electrode pattern and having a first surface and a second surface which are facing each other; an insulating pattern provided on the first electrode and exposing the first surface of the first electrode; an organic light emitting layer provided on the first surface of the first electrode and exposing the first electrode and the insulating pattern; a first electrode pad disposed on the first electrode and laterally spaced apart from the organic light emitting layer; a second electrode provided on the organic light emitting layer and extending onto the insulating pattern; and a second electrode pad provided on the second electrode, wherein the second electrode pad overlaps the insulating pattern when viewed on a plane.

In an embodiment, the substrate may include a first region, a second region, and a third region, the first electrode and the first electrode pad overlapping the first region, the first electrode of the substrate, the organic light emitting layer, and the second electrode overlapping the second region of the substrate, and the insulating pattern, the second electrode, and the second electrode pad overlapping the third region of the substrate.

In an embodiment, the organic light emitting diode may be disposed next to the second electrode pad when viewed on a plane.

In an embodiment, the opening may expose the second surface of the first electrode; and the buffer layer may extend into the opening and contact the second surface of the first electrode.

In an embodiment, a top surface of the insulating pattern may be coplanar with the first surface of the first electrode and face the second electrode.

In an embodiment, an external light extraction pattern provided on a bottom surface of the substrate.

In an embodiment, a gas barrier layer disposed between the substrate and the first electrode may be further included.

DETAILED DESCRIPTION

Figure 1A:
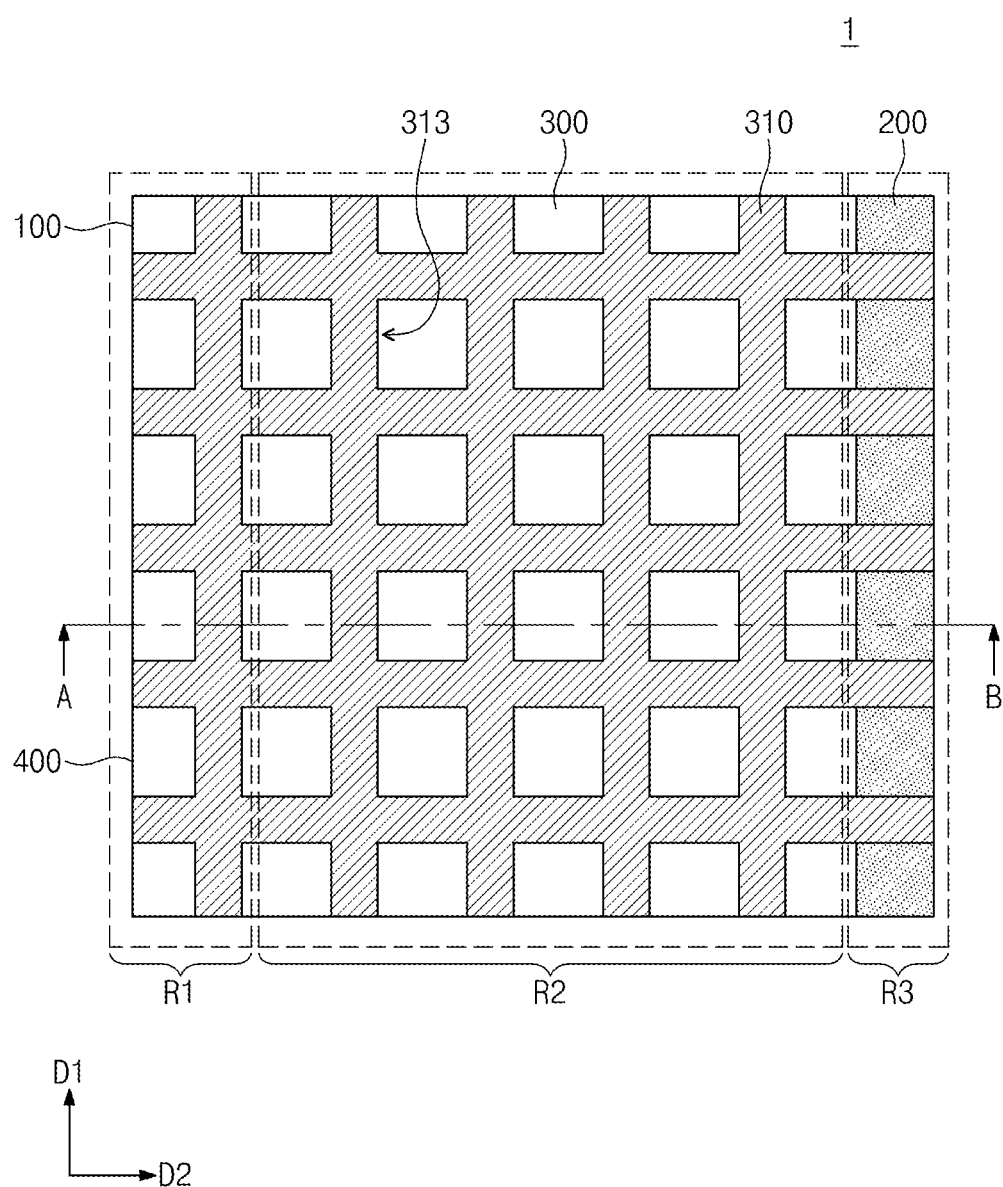
FIG. 1A is a plan view illustrating a first electrode according to embodiments of the inventive concept.

Exemplary embodiments of the present invention are described with reference to the accompanying drawings in order to more effectively describe the features and effects of the present invention. However, the present invention is not limited to the embodiments described below and may be realized in various configurations and modified in various ways. The embodiments provide a more complete description of the present invention and are provided so that a person skilled in the art may better understand the scope of the invention. A person skilled in the art will be able to understand the appropriate circumstances in which the inventive concept can be performed.

The terminology used herein is for the purpose of describing particular embodiments only and is not intended to be limiting of the invention. As used herein, singular forms are intended to include the plural forms as well, unless the context clearly indicates otherwise. The terms "comprise" and/or "comprising", when used in this specification, specify the presence of stated elements, steps, operations, and/or components, but do not preclude the presence or addition of one or more other elements, steps, operations, and/or components.

In the specification, when a film (or layer) is indicated as being "on" another film (or layer) or substrate, said film (or layer) may be formed directly on the other film (or layer) or substrate, or an intervening third film (or layer) may be present.

It will be understood that, although the terms first, second, third, etc. may be used herein to describe various regions, films (or layers), etc., these regions, films (or layers) should not be limited by these terms. These terms are only used to distinguish one region, film (or layer) from another region, film (or layer). Thus a first film in one embodiment may be termed a second film in other embodiments. Such embodiments may also include complementary embodiments thereof. Like reference numerals refer to like elements throughout.

Unless otherwise defined, all terms used in the embodiments of the present invention have the same meaning as commonly understood by a person skilled in the art to which this invention belongs.

Hereinafter, description is given of a method for manufacturing an integrated substrate for an organic light emitting diode according to an embodiment of the inventive concept.

FIG. 1A is a plan view illustrating a first electrode according to embodiments of the inventive concept. FIGS. 1B to 1E are cross-sectional views illustrating a manufacturing process for a first electrode according to embodiments, and correspond to a cross section along line A-B in FIG. 1A.

Figure 1B:
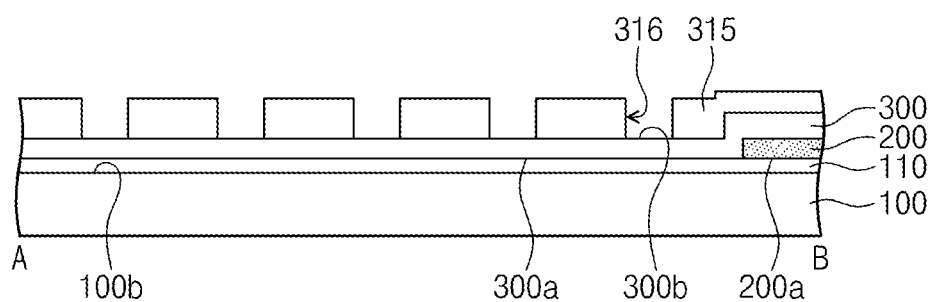
FIGS. 1B to 1E are cross-sectional views illustrating a manufacturing process for a first electrode according to embodiments.

Referring to FIGS. 1A and 1B, a sacrificial layer 110, an insulating pattern 200, and a first electrode 300 may be formed on the top surface 100b of a release substrate 100. The release substrate 100 is a substrate composed of silicon, glass, a ceramic, or a ceramic coated polymer film. When storing an object, the object may be stored by being adhered to an adhesion surface of the release substrate 100, and when using the object, the object may be peeled away from the adhesion surface. The object may be protected by the release substrate 100 during the storing. The top surface 100b of the release substrate 100 may function as an adhesion surface. According to an embodiment, the top surface 100b of the release substrate 100 may be flat. For example, the top surface 100b of the release substrate 100 may have a center-line surface roughness (Ra) of at most about 2 nm, and preferably, a center-line surface roughness of at most about 0.5 nm. A plasma treatment operation may be performed on the top surface 100b of the release substrate 100.

A sacrificial layer 110 may be formed on the release substrate 100. The top surface 100b of the release substrate 100 may be flat such that the sacrificial layer 110 has a flat top surface. Metals may have a low adhesive strength with respect to glass or ceramic. The sacrificial layer 110 may include metal and thus have a low adhesive strength with respect to the release substrate 100. The plasma treatment operation may cause the sacrificial layer 110 to have an even lower adhesive strength with respect to the release substrate 100.

An insulating pattern 200 may be formed on the sacrificial layer 110. As illustrated in FIG. 1A, the insulating pattern 200 may be formed near the edge of the release substrate 100. The insulating pattern 200 and the edge of the release substrate 100 may extend in a first direction D1. Here, the first direction D1 may be parallel to the top surface 100b of the release substrate 100. However, the planar arrangement of the insulating pattern 200 is not limited thereto, and may be varied.

A first electrode 300 may be formed on the sacrificial layer 110 and the insulating pattern 200. The first electrode 300 may be transparent. The first electrode 300 may have a first surface 300a and a second surface 300b which are facing each other. The first surface 300a may face toward the sacrificial layer 110. Since the top surface of the sacrificial layer 110 is flat, the first electrode 300 may have the flat first surface 300a. For example, the first surface 300a of the first electrode 300 may have a center-line surface roughness (Ra) of at most about 2 nm, desirably, at most about 0.5 nm. Here, the flat first surface 300a of the first electrode 300 may indicate a portion contacting the sacrificial layer 110. The first surface 300a of the first electrode 300 may be coplanar with a first surface 200a of the insulating pattern 200. The first electrode 300 may extend onto the insulating pattern 200. The first electrode 300 may include a transparent conductive oxide, for example, indium tin oxide (ITO), aluminum zinc oxide (AZO), indium zinc oxide (IZO), tin oxide, fluorine doped tin oxide (F-doped tin oxide), antimony-doped tin oxide (Sb-doped tin oxide), zinc oxide, zinc sulfide, zinc tin oxide, indium zinc tin oxide, and aluminum-doped tin oxide (Al-doped zinc tin oxide). The first electrode 300 may include conductive polymer. The first electrode 300 may be formed using a sputtering method, an evaporation method, a wet coating method, a printing method, or a chemical vapor deposition (CVD) method. The first electrode 300 may have a thickness of at most about 200 nm. The first electrode 300 may function as an anode, but is not limited thereto.

A screen printing pattern 315 may be provided on the first electrode 300. The screen printing pattern 315 may have a screen opening 316 exposing the second surface 300b of the first electrode 300.

Figure 1C:
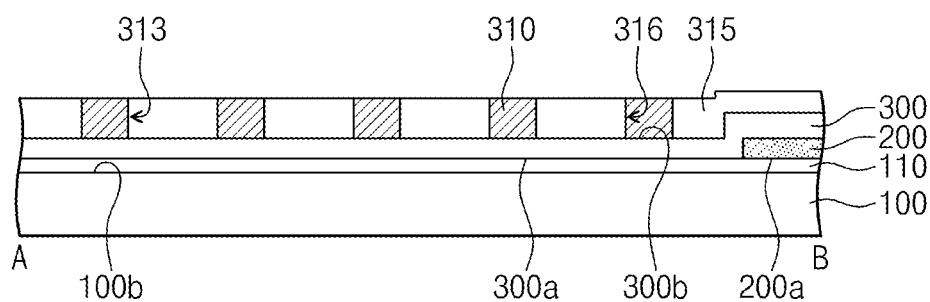

Referring to FIGS. 1A and 1C, an auxiliary electrode pattern 310 may be formed on the first electrode 300. In an example, a metal particle solution may be applied inside of the screen opening 316 to form the auxiliary electrode pattern 310. For example, the metal particle solution may contain a solvent and a metal particle in the solvent. The metal particle may include at least one of aluminum (Al), titanium (Ti), tungsten (W), chrome (Cr), nickel (Ni), copper (Cu), gold (Au), silver (Ag), platinum (Pt), molybdenum (Mo), palladium (Pd), rhodium (Rh), indium (In), zinc (Zn), or alloys thereof. The auxiliary electrode pattern 310 may have an opening 313 exposing the second surface 300b of the first electrode 300. The screen printing pattern 315 may later be removed. In another example, a catalyst layer (not shown) may be formed on the second surface 300b of the first electrode 300 before forming the screen printing pattern 315. The catalyst layer may include palladium (Pd), but the catalyst layer is not limited palladium (Pd). The auxiliary electrode pattern 310 may be formed by electroplating or electroless plating using the catalyst layer. In still another example, catalyst layer may not be formed and the auxiliary electrode pattern 310 may be formed by electroplating by applying voltage to the first electrode 300. The screen printing pattern 315 may later be removed. In still another example, a printing process is used to form the auxiliary electrode pattern 310. The metal particle solution is printed on the first electrode 300 by a screen printing, an off-set printing, a gravure printing, or an ink-jet printing method without the screen printing pattern 315. In these cases, photolithography and etching processes for forming the opening 313 may be excluded. When the auxiliary electrode pattern 310 is formed using a deposition process, additional photolithography and etching operations for forming the opening 313 may be required. The auxiliary electrode pattern 310 may be opaque. As illustrated in FIG. 1, the auxiliary pattern 310 may be in the shape of a grid when viewed on a plane. For example, the auxiliary electrode pattern 310 may extend in the first direction D1 and a second direction D2. Here, the second direction D2 may be parallel to the top surface 100b of the release substrate 100 and intersect with the first direction D1. However, the planar shape of the auxiliary electrode pattern 310 is not limited thereto and may be varied. The auxiliary electrode pattern 310 may have a lower resistance than the first electrode 300.

Figure 1D:
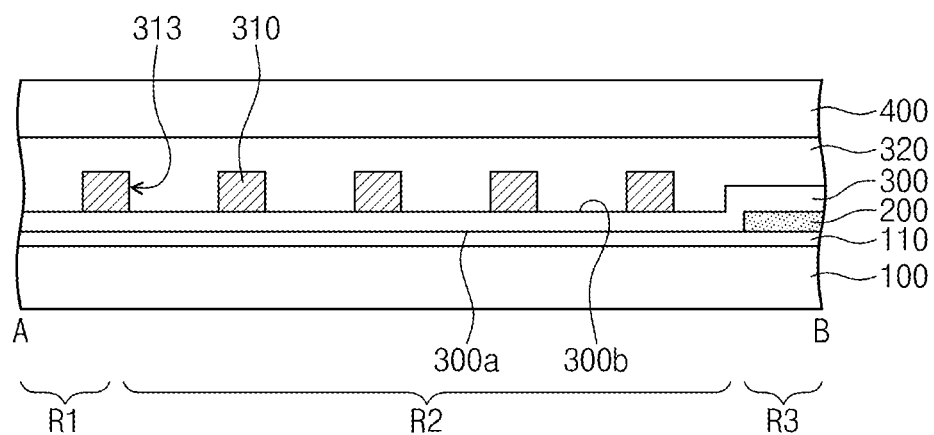

Referring to FIGS. 1A and 1D, a first buffer layer 320 and a substrate 400 may be formed on the auxiliary electrode pattern 310. The first buffer layer 320 may cover the auxiliary electrode pattern 310 and extend into the opening 313. The first buffer layer 320 may be transparent. The auxiliary electrode pattern 310 may be sealed by the first buffer layer 320. Forming the first buffer layer 320 may include applying a first precursor solution to thereby form a first precursor layer (not shown) and curing the first precursor layer. The first precursor solution may be applied onto the auxiliary electrode pattern 310 using spin coating, slot die coating, nozzle printing, or spray coating methods. In an example, an organic solution such as polyacrylic, polyimide, polyethylene, polypropylene, or polystyrene may be used as the first precursor solution. In another example, an oxide nanoparticle-containing inorganic solution may be used as the first precursor solution. Here, the inorganic solution may be in a sol state or a colloid state. In still another example, an organic-inorganic hybrid solution having organic and inorganic solutions mixed therein may be used as the first precursor solution. In still another example, polysilazane or polysiloxane may be used as the first precursor solution. On the second surface 300b of the first electrode 300, the first precursor solution may be filled into the opening 313 of the auxiliary electrode pattern 310. A protrusion corresponding to the opening 313 of the auxiliary electrode pattern 310 may need to be formed on the bottom surface of the first buffer layer 320. According to an embodiment of the inventive concept, since the first buffer layer 320 is formed using the first precursor solution, the first buffer layer 320 may be provided in the opening 313 without additional patterning operations, such as photolithography and etching operations, of the first buffer layer 320. Thus, manufacture of the first buffer layer 320 may be simplified. Curing of the first precursor solution may include thermal curing or photo curing, and the photo curing may be performed using ultraviolet radiation or infrared radiation. The top surface of the first buffer layer 320 on the auxiliary electrode pattern 310 may be disposed on the same level as the top surface of the first buffer layer 320 on the opening 313 and the top surface of the first buffer layer 320 on the insulating pattern 200, or on a similar level.

The substrate 400 may be formed on the first buffer layer 320. The substrate 400 may be transparent and flexible. The substrate 400 may be satisfactorily adhered to the first electrode 300 through the first buffer layer 320. The substrate 400 may contain polyacrylic, polyimide, polycarbonate, polyethylene, polyethylene terephthalate (PET), polyethylene naphthalate (PEN), or polypropylene. As illustrated in FIG. 1A, the insulating pattern 200 may be provided near the edge of the substrate 400. The substrate 400 may have a first region R1, a second region R2, and a third region R3. The insulating pattern 200 may overlap with the third region R3 of the substrate 400. The first region R1 may correspond to one end of the substrate 400, and the third region R3 may correspond to the opposite end of the substrate 400. The one end and the opposite end are shown facing each other, but are not limited thereto. The second region R2 may be provided between the first region R1 and the third region R3.

Figure 1E:
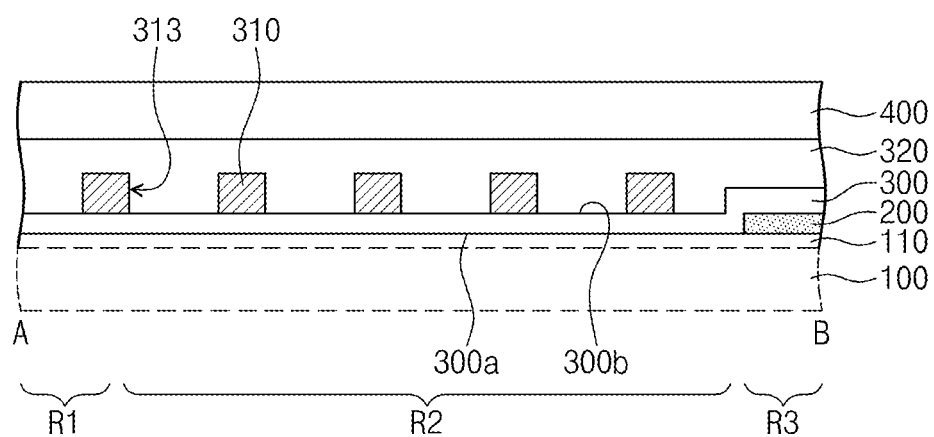

Referring to FIGS. 1A and 1E, the release substrate 100 and the sacrificial layer 110 may be removed to expose the first surface 300a of the first electrode 300 and the insulating pattern 200. For example, the release substrate 100 may be removed by using a peeling apparatus. The release substrate 100 has a low adhesive strength with respect to the sacrificial layer 110, and thus can be easily peeled from the sacrificial layer 110. The release substrate may be more easily peeled from the sacrificial layer 110 through the plasma treatment operation performed in FIG. 1B. Thereby, the sacrificial layer 110 may be exposed.

The sacrificial layer 110 may be etched to expose the first surface 300a of the first electrode 300 and the insulating pattern 200. Here, the sacrificial layer 110 may have a selective etching property with respect to the first electrode 300. In an example, the sacrificial layer 110 may be wet etched using at least one of hydrochloric acid, sulfuric acid, nitric acid, acetic acid, oxalic acid, phosphoric acid, an aqueous solution of iron chloride ($FeCl_3$), an aqueous solution of potassium chloride (KCl), a buffered oxide etchant (BOE), or a mixture thereof. Here, the buffered oxide etchant (BOE) may be a mixture of ammonium fluoride (NH4F) and hydrochloric acid (HF). In another example, the sacrificial layer 110 may be dry etched using oxygen plasma.

According to another embodiment, removal of the sacrificial layer 110 may be performed at the same time as removal of the release substrate 100. For example, when removing the release substrate 100, the sacrificial layer 110 may also be removed. The first surface 300a of the first electrode 300 on the first region R1 and the second region R2 may be exposed by the insulating pattern 200. The exposed first surface 300a of the first electrode 300 may be flat. For example, the first surface 300a of the first electrode 300 may have center-line surface roughness (Ra) of at most about 2 nm. The first surface 300a of the first electrode 300 in the third region R3 of the substrate 400 may be covered by the insulating pattern 200. Manufacture of an integrated substrate may be completed through the manufacturing examples described thus far. In the present application, an integrated substrate may indicate a substrate 100 in which a first electrode 300 is formed.

Figure 2A:
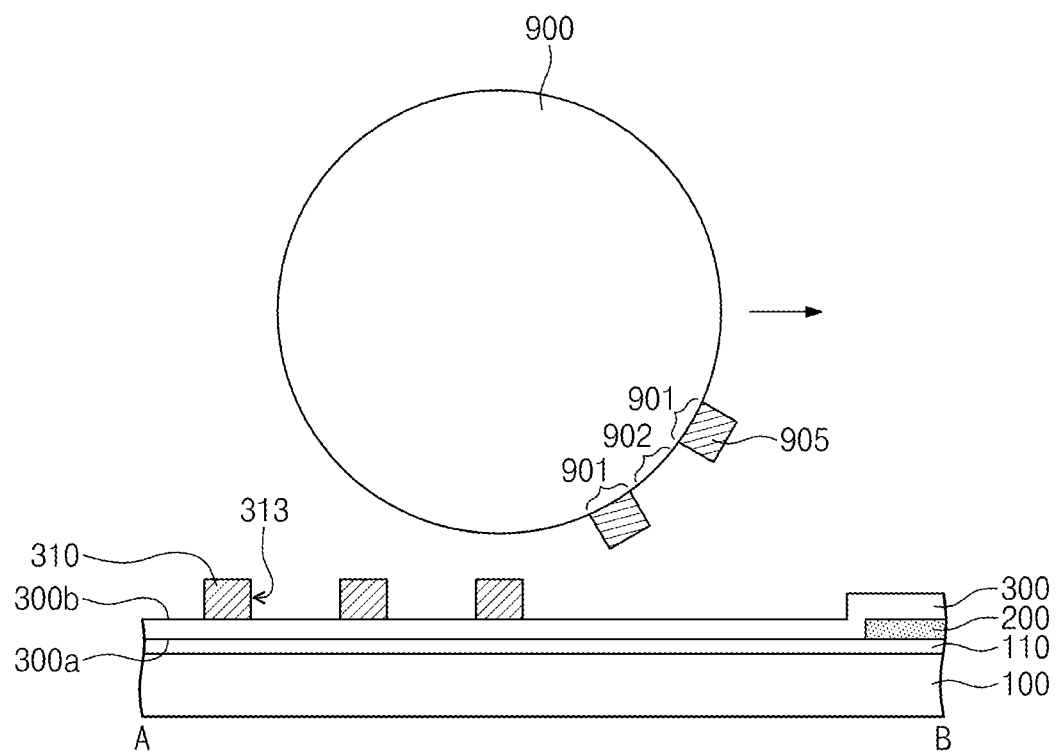
FIGS. 2A to 2C are cross-sectional views for illustrating the manufacture of an auxiliary electrode pattern according to other embodiments.
Figure 2B:
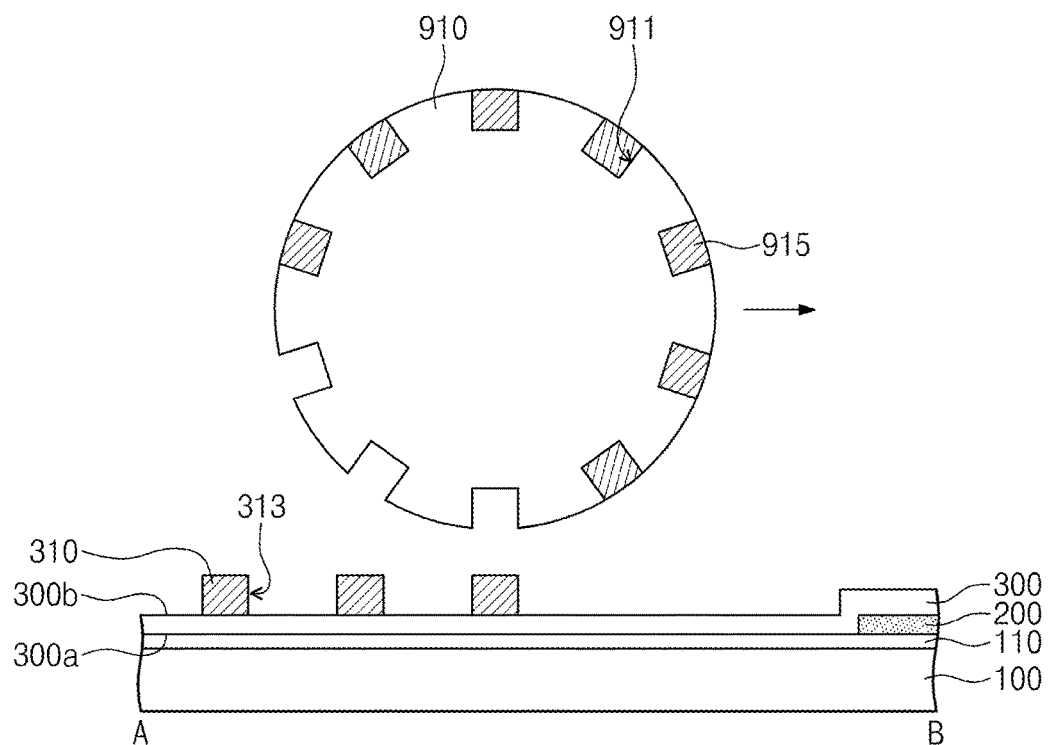
Figure 2C:
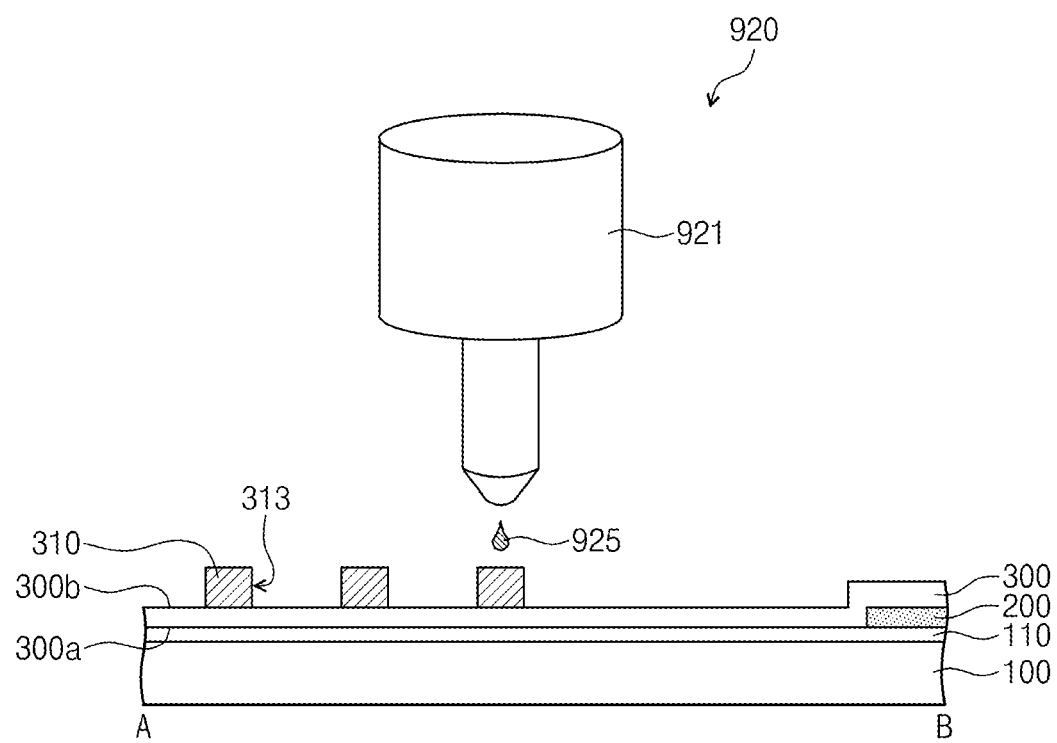

FIGS. 2A to 2C are cross-sectional views for illustrating the manufacture of an auxiliary electrode pattern according to other embodiments, and correspond to cross sections along line A-B in FIG. 1. Hereinafter, descriptions already given above will not be repeated.

Referring to FIGS. 2A to 2C, a sacrificial layer 110 and an insulating pattern 200 may be formed on a release substrate 100. An auxiliary electrode pattern 310 may be manufactured by using a metal particle solution, and include an opening 313. The metal particle solution may be the same or similar to that illustrated in FIG. 1C.

As in FIG. 2A, an auxiliary electrode pattern 310 may be formed using an offset printing method. For example, a metal ink pattern 905 may be formed on a blanket 900. The metal ink pattern 905 may be formed by applying the metal particle solution illustrated in FIG. 1C. The blanket 900 may include hydrophilic portions 901 and hydrophobic portions 902. The metal ink pattern 905 may be provided on the hydrophilic portions 901 of the blanket 900, but not on the hydrophobic portions 902. Conversely, the metal ink pattern 905 may be provided on the hydrophobic portions 902 of the blanket, but not on the hydrophilic portions 901. The metal ink pattern 905 may be copied onto a first electrode 300 to form the auxiliary electrode pattern 310.

Referring to FIG. 2B, an auxiliary electrode pattern 310 may be formed using a gravure printing method. For example, a roller 910 having a recess 911 may be provided. A metal particle solution 915 may be provided in the recess 911. The roller 910 may move on the first electrode 300. The metal particle solution 915 may be applied onto the first electrode 300 to form the auxiliary electrode pattern 310.

Referring to FIG. 2C, an auxiliary electrode pattern 310 may be formed using a nozzle printing method. A discharge apparatus 920 may include a main tank (not shown) for storing a metal particle solution 925 and a nozzle 921 for discharging the metal particle solution 925. The metal particle solution 925 may be provided from the nozzle 921 onto the first electrode 300. Referring to FIG. 2C along with FIG. 1A, the nozzle 921 may move on the first electrode 300 along a first direction D1 and/or a second direction D2 to form the auxiliary electrode pattern 310. Methods for forming the auxiliary electrode pattern 310 are not limited to FIGS. 2A to 2C, and various methods, such as an electric discharge method, using the metal particle solution may be used for forming the auxiliary electrode pattern 310.

Figure 3A:
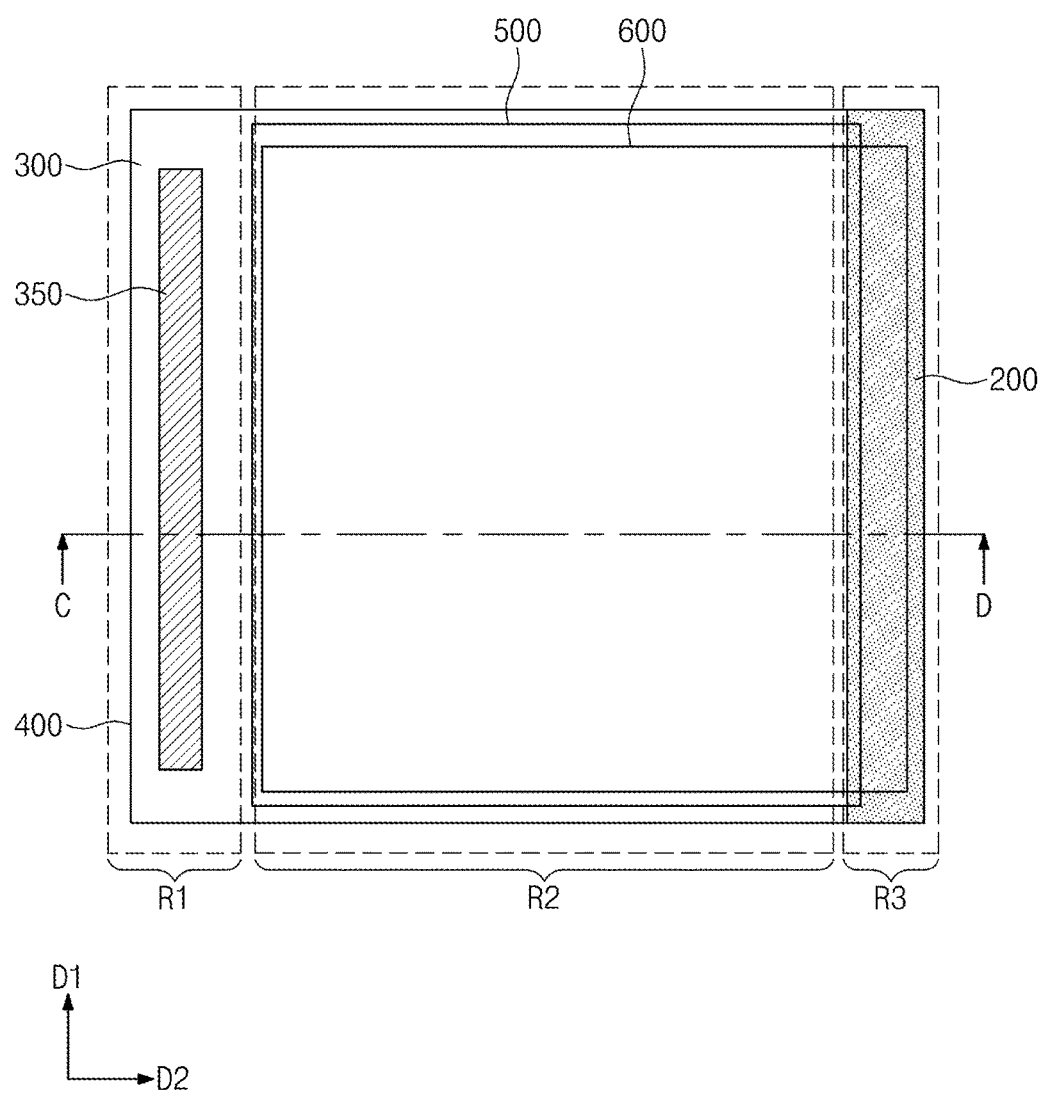
FIGS. 3A and 4A are plan views for illustrating a method for manufacturing an organic light emitting diode according to embodiments.
Figure 3B:
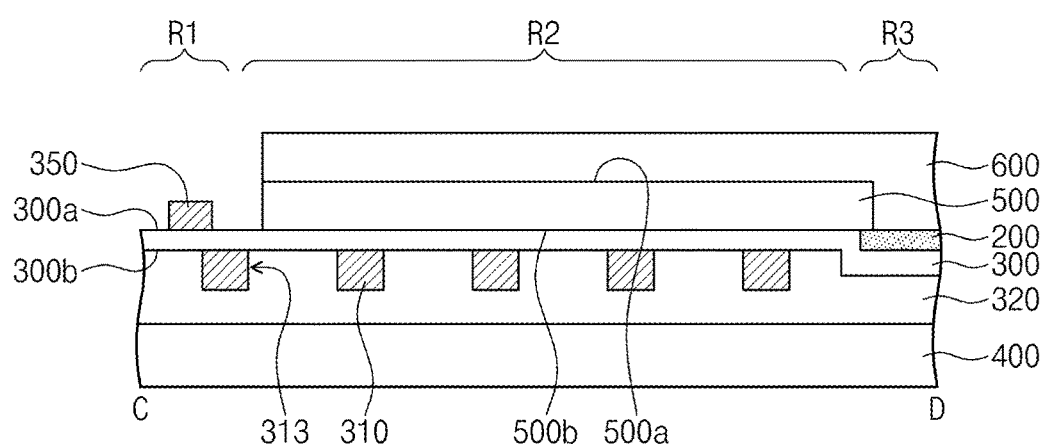
FIGS. 3B and 4B are cross sections along line C-D in FIGS. 3A and 4A, respectively.
Figure 4A:
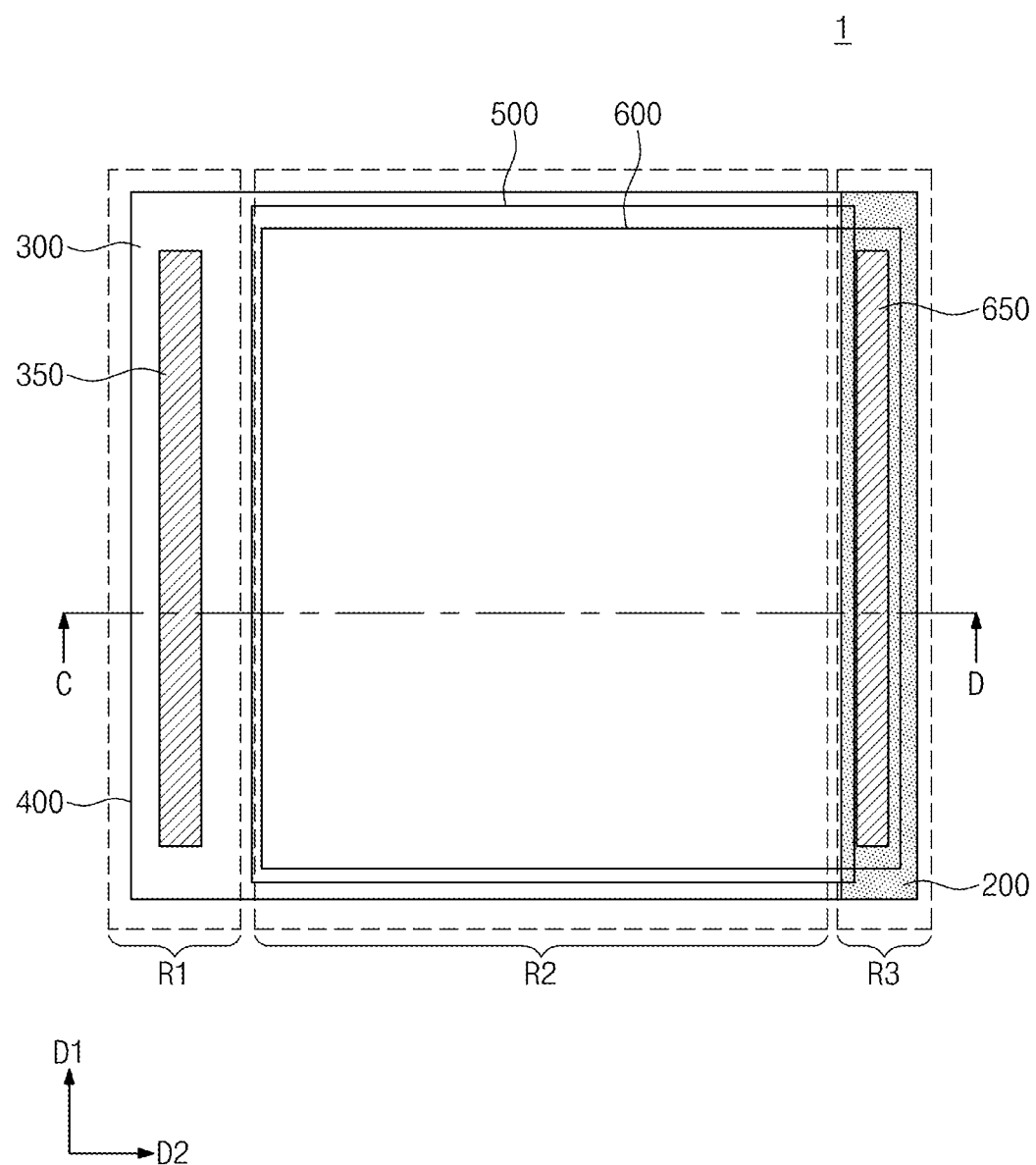
Figure 4B:
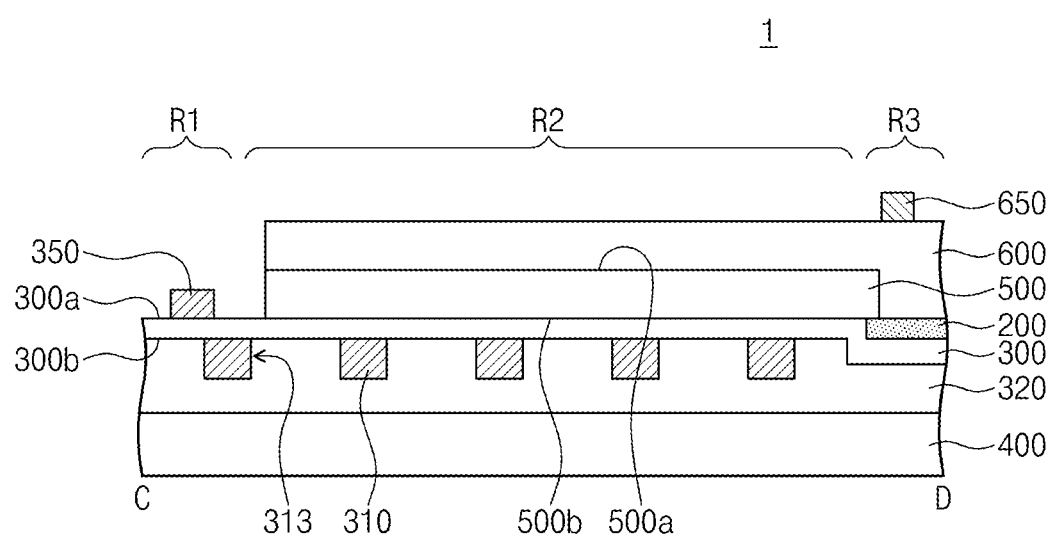

FIGS. 3A and 4A are plan views form illustrating a method for manufacturing an organic light emitting diode according to embodiment. FIGS. 3B and 4B are cross sections along line C-D in FIGS. 3A and 4A, respectively.

Referring to FIGS. 3A and 3B, a substrate including a first buffer layer 320, an auxiliary electrode pattern 310, a first electrode 300, and an insulating pattern 200 may be prepared. Here, the substrate 400, the first buffer layer 320, the auxiliary electrode pattern 310, the first electrode 300, and the insulating pattern 200 may be manufactured as illustrated in FIGS. 1A to 1E. The substrate 400 may be disposed such that a first surface 300a faces upward.

An organic light emitting layer 500 may be formed on the first surface 300a of the first electrode 300. The first surface 300a of the first electrode 300 is flat, and the organic light emitting layer 500 may have a flat top surface 500a and a flat bottom surface 500b. For example, the top surface 500a and bottom surface 500b of the organic light emitting layer 500 may have a center-line surface roughness (Ra) of at most about 2 nm. Consequently, during operation of an organic light emitting diode 1, it may be prevented that an electrical short caused by a build up of current in a protruding portion (not shown) on the top surface 500a or bottom surface 500b of the organic light emitting layer 500 causes an. The organic light emitting diode 1 may exhibit improved reliability. The organic light emitting layer 500 may contact the first electrode 300 on a second region R2 and expose the first electrode 300 on a first region R1. The organic light emitting layer 500 may be excluded from a third region R3 to expose the insulating pattern 200 on the third region R3.

A second electrode 600 may be formed on the organic light emitting layer 500. As in FIG. 3A, the second electrode 600 may be provided on the second region R2 and third region R3 of the substrate 400 and not overlap the first region R1. As in FIG. 3B, the second electrode 600 may contact the organic light emitting layer 500 on the second region R2 of the substrate 400. The second electrode 600 may cover the insulating pattern 200 on the third region R3. When the insulating pattern 200 is excluded, the second electrode 600 may contact the first electrode 300 in the third region R3 of the substrate 400. According to embodiments, the insulating pattern 200 may be provided to prevent an electrical short from occurring between the first electrode 300 and the second electrode 600. The second electrode 600 may contain a transparent conductive oxide. For example, the second electrode 600 may include one of the materials described in the example of the first electrode 300. The second electrode 600 may function as a cathode, but is not limited thereto.

A first electrode pad 350 may be formed on the first electrode 300. The first electrode pad 350 may contain a conductive material, for example, a metal. As illustrated in FIG. 3A, when viewed on a plane, the first electrode pad 350 may overlap with the first region R1 of the substrate 400. As in FIG. 3B, the first electrode pad 350 may be disposed on the first electrode 300, which is exposed by the organic light emitting layer 500, and contact the first electrode 300. The first electrode pad 350 may be disposed next to the organic light emitting layer 500 and the second electrode 600. Since the first electrode pad 350 does not contact the second electrode 600, the occurrence of an electrical short between the first electrode 300 and the second electrode 600 may be prevented. The time at which the first electrode pad 350 is formed may be varied. For example, the first electrode pad 350 may be formed before the organic light emitting layer 500 is formed, or before the second electrode 600 is formed.

Referring to FIGS. 4A and 4B, a second electrode pad 650 may be formed on the second electrode 600 and thereby contact the second electrode 600. The second electrode pad 650 may contain a metal. As illustrated in FIG. 4A, when viewed on a plane, the second electrode pad 650 may be provided on the third region R3 of the substrate 400 and overlap the insulating pattern 200. Referring to FIG. 4B, the organic light emitting layer 500 may be excluded from the third region R3 of the substrate 400 such that damage to the organic light emitting layer 500 does not occur in the process of forming the second electrode pad 650. An organic light emitting diode 1 may be completed through the manufacturing examples described thus far.

According to embodiments, the auxiliary electrode pattern 310 may have a lower resistance than the first electrode 300 and be electrically connected to the first electrode 300. The organic light emitting diode 1 may include the auxiliary electrode pattern 310 and thereby prevent an IR drop effect. The organic light emitting diode 1 may achieve a uniform luminescent brightness. The auxiliary electrode pattern 310 may be opaque, whereas the first electrode 300, the first buffer layer 320, and the substrate 400 may be transparent. The auxiliary electrode pattern 310 may have an opening 313 which exposes the first electrode 300. Light generated in the organic light emitting layer 500 may be externally emitted through the opening 313 in the auxiliary electrode pattern 310.

Hereinafter, description is given of the manufacture of an integrated substrate for an organic light emitting diode according to other embodiments, and an organic light emitting diode including the same.

Figure 5A:
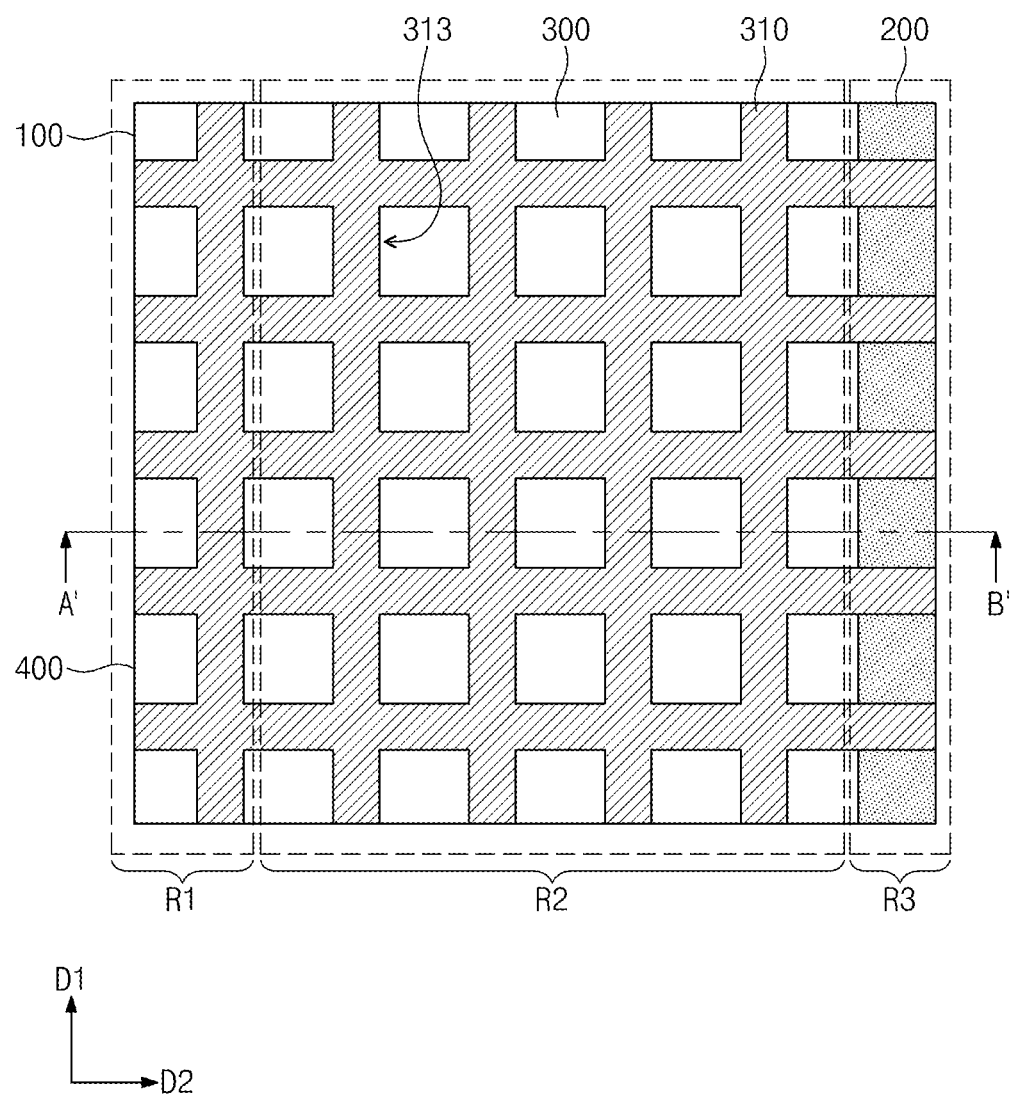
FIG. 5A is a plan view illustrating a first electrode according to other embodiments.
Figure 5B:
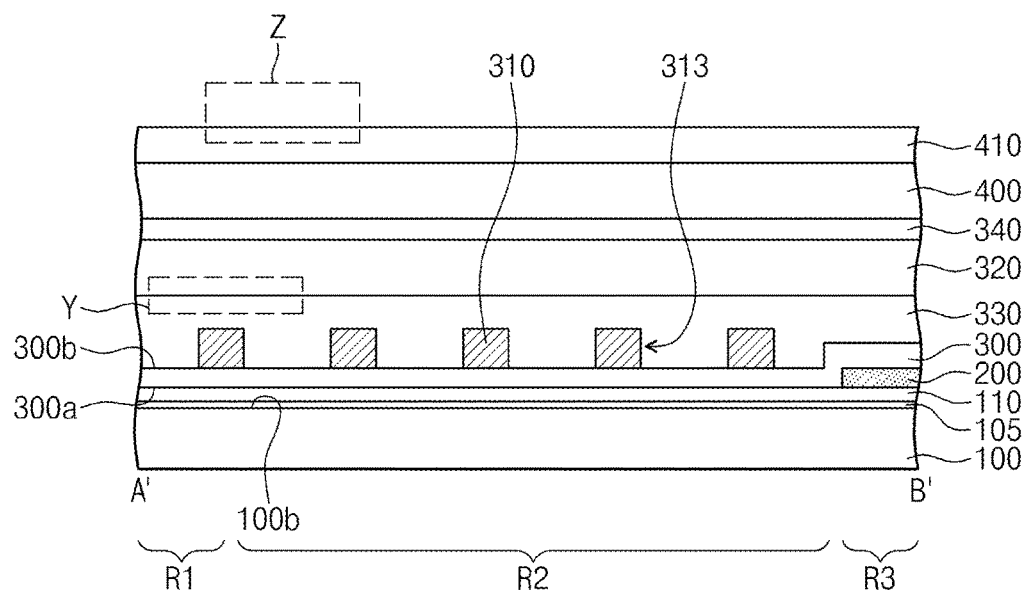
FIGS. 5B and 5C are cross-sectional views illustrating a manufacturing process for a first electrode according to other embodiments.
Figure 5C:
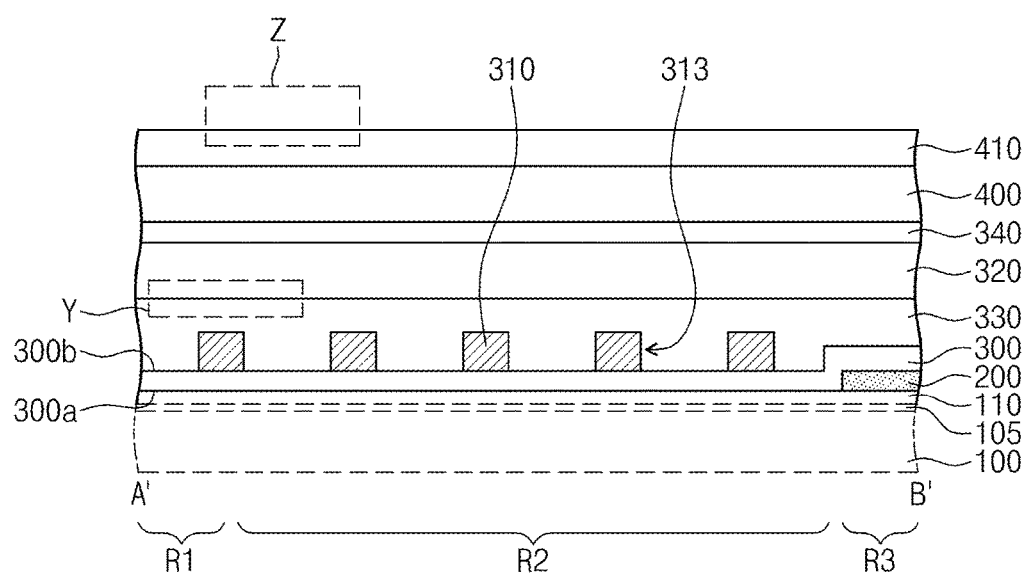

FIG. 5A is a plan view illustrating a first electrode according to other embodiments. FIGS. 5B and 5C are cross-sectional views illustrating a manufacturing process for a first electrode according to different embodiments, and correspond to cross sections along line A'-B' in FIG. 5A. Hereinafter, descriptions already given above will not be repeated.

Referring to FIGS. 5A and 5B, an auxiliary sacrificial layer 105 may be formed on the top surface 100b of a release substrate 100. The sacrificial layer 105 may include one of a self-assembled mono-layer (SAM), a block copolymer, or a silicone (hexamethyldisilazane, HMDS). A sacrificial layer 110, an insulating pattern 200, a first electrode 300, and an auxiliary electrode pattern 310 may be formed on the auxiliary sacrificial layer 105 by using methods identical to those described above.

A second buffer layer 330 may be formed on the auxiliary electrode pattern 310 and fill in an opening 313 of the auxiliary electrode pattern 310. The second buffer layer 330 may be formed by applying a second precursor solution onto the auxiliary electrode pattern 310 to form a second precursor layer (not shown), and then curing the second precursor layer. The second precursor solution may contain zirconium oxide, iron oxide, polysilazane, polysiloxane, or tin oxide. The second buffer layer 330 may be provided in the opening 313 without going through a separate patterning operation. Consequently, manufacture of the second buffer layer 330 may be simplified. The second buffer layer 330 may be transparent. Hereinafter, the second buffer layer 330 will be described in greater detail.

Figure 6A:
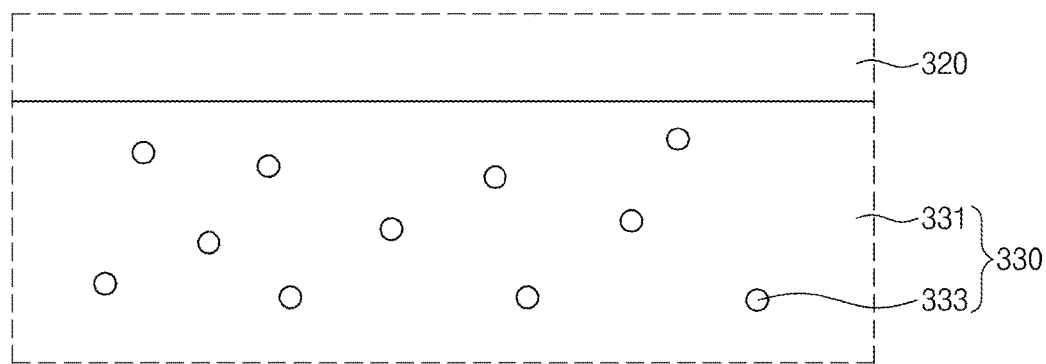
FIGS. 6A and 6B are cross-sectional views illustrating a second buffer layer according to embodiments.
Figure 6B:
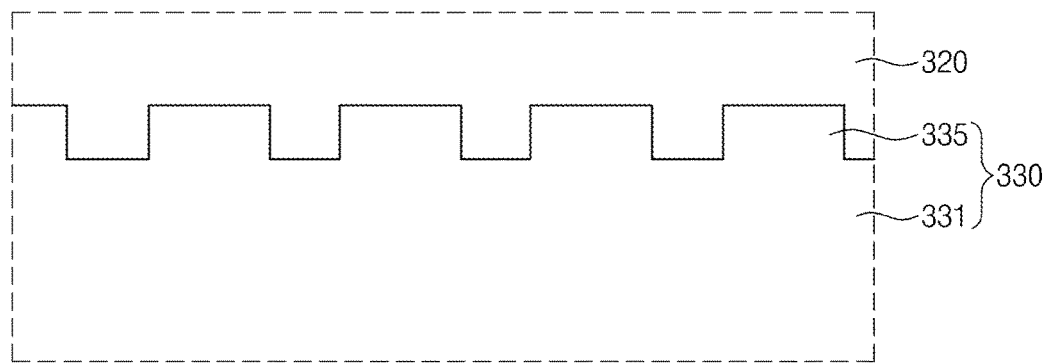

FIGS. 6A and 6B are cross-sectional views illustrating a second buffer layer according to embodiments, and correspond to cross sections illustrating in an expanded manner the Y region in FIG. 5B.

Referring to FIG. 6A, a second buffer layer 330 may include a light extraction layer 331 and particles 333. The light extraction layer 331 may contain silicon oxide, polyacrylic, polyimide, polyurethane, polystyrene, polyethylene, magnesium oxide, titanium oxide, zirconium oxide, iron oxide, or tin oxide. The particles 333 may contain silicon oxide, polystyrene, polyethylene, magnesium oxide, titanium oxide, zirconium oxide, iron oxide, or tin oxide. The particles 333 may be distributed in the light extraction layer 331. For example, the particles 333 may have a refractive index lower than 1.7 and the light extraction layer 331 may have a refractive index of at least 1.7. Conversely, the particles 333 may have a refractive index of at least 1.7 and the light extraction layer 331 may have a refractive index lower than 1.7. In another example, the particles 333 may be hollow particles and have shells (not shown) containing air therein.

Referring to FIG. 6B, the second buffer layer 330 may include the light extraction layer 331 and protruded portions 335 which are on the light extraction layer 331. The protruded portions 325 may have an average height of about 100 nm to about 1000 nm. The protruded portions 325 may have an average width of about 100 nm to about 1000 nm. The protruded portions 325 may be formed on the top surface of the light extraction layer 331 by performing an imprinting operation.

Referring again to FIGS. 5A and 5B, a first buffer layer 320 may be formed on the second buffer layer 330. The first buffer layer 320 and formation method thereof may be the same as illustrated in FIG. 1D. The first buffer layer 320 may have a different refractive index than the second buffer layer 330. For example, the first buffer layer 320 may have a lower refractive index than the second buffer layer 330. When the second buffer layer 330 has the protruded portions 325 as in FIG. 6B, the first buffer layer 320 may be extended in-between the protruded portions 325.

A gas barrier layer 340 may be formed on the first buffer layer 320. In an example, the gas barrier layer 340 may be a single film containing an inorganic material. In another example, the gas barrier layer 340 may be a multilayer in which inorganic layers (not shown) and organic layers (not shown) are laminated. Contrary to how it is shown herein, the gas barrier layer 340 may be formed between the second buffer layer 330 and the first buffer layer 320. A substrate 400 may be formed on the gas barrier layer 340. An external light extraction pattern 410 may be formed on the substrate. The external light extraction pattern 410 may be transparent.

FIGS. 7A to 7D are cross-sectional views illustrating an external light extraction pattern according to embodiments, and correspond to cross sections illustrating in an expanded manner the Z region in FIG. 5.

Figure 7A:
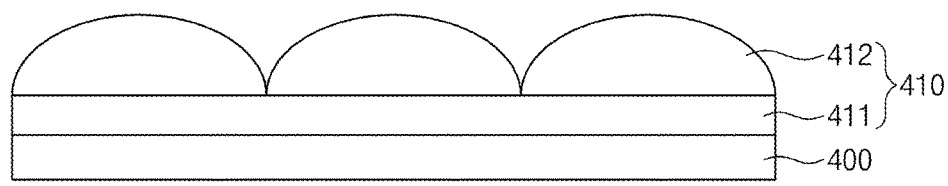
FIGS. 7A to 7D are cross-sectional views illustrating an external light extraction pattern according to embodiments.

Referring to FIG. 7A, an external light extraction pattern 410 may include a transparent film 411 and a micro lens array (MLA) 412 disposed on the transparent film 411. The transparent film 411 may be flexible. The transparent film 411 may be closer to a substrate 400 than is the micro lens array 412.

Figure 7B:
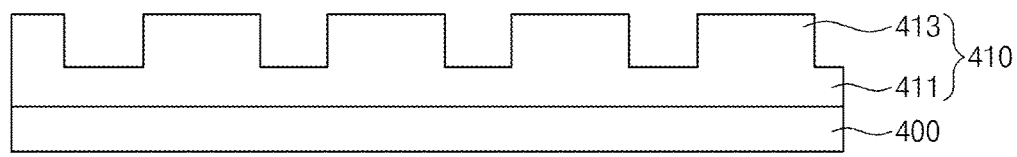

Referring to FIG. 7B, an external light extraction pattern 410 may have protrusions 413. A transparent film 411 may be formed on a substrate 400, and the transparent film 411 may be patterned to form the protrusions 413.

Figure 7C:
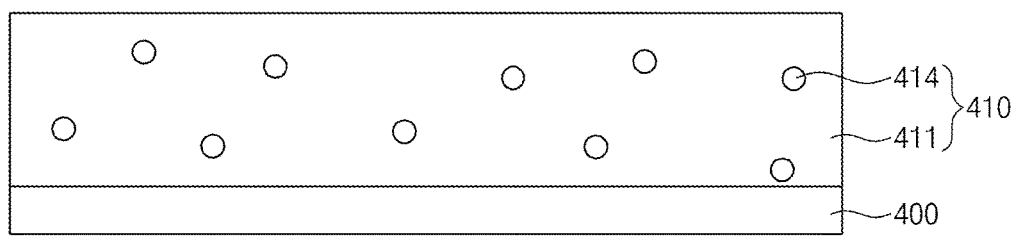

Referring to FIG. 7C, an external light extraction pattern 410 may include a transparent film 410 and nanoparticles 414. The transparent film 411 may contain polyacrylic, polyimide, polyurethane, polystyrene, or polyethylene. The nanoparticles 414 may be provided in the transparent film 411 in a distributed manner. The nanoparticles 414 may contain silicon oxide, titanium oxide, zirconium oxide, iron oxide, tin oxide, or magnesium oxide. In another embodiment, the nanoparticles 414 may be hollow particles. The nanoparticles 414 may have a different refractive index than the transparent film 411.

Figure 7D:
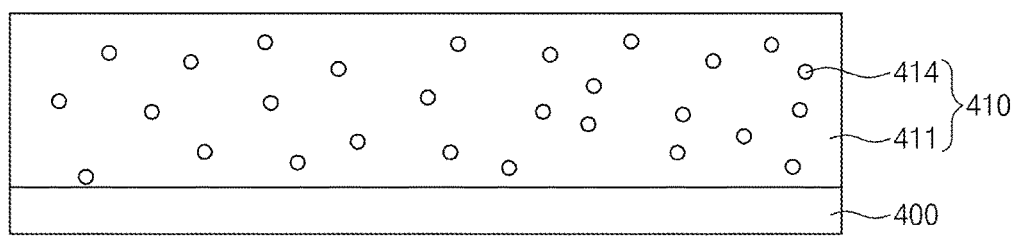

Referring to FIG. 7d, an external light extraction pattern 410 may include a transparent film 411 having pores 415 therein. The pores 415 may contain air, and the air may have a different refractive index than the transparent film 411.

Referring to FIGS. 5A and 5C, the release substrate 100, the auxiliary sacrificial layer 105, and the sacrificial layer 110 may be removed to expose a first surface 300a of the first electrode 300 and the insulating pattern 200. The release substrate 100 may be removed using a peeling apparatus (not shown). In an example, the auxiliary sacrificial layer 105 may be removed along with the release substrate 100 to expose the sacrificial layer 110. Due to the auxiliary sacrificial layer 105, the release substrate 100 can be more easily removed from the sacrificial layer 110. The sacrificial layer 110 may be removed using an etching operation. In another example, the auxiliary sacrificial layer 105 may be remaining after the removal operation of the release substrate 100. The auxiliary sacrificial layer 105 may also be removed in the etching operation of the sacrificial layer 110. In still another example, the auxiliary sacrificial layer 105 and the sacrificial layer 110 may be removed along with the release substrate 100.

According to an embodiment, the formation of at least one of the auxiliary sacrificial layer 105, the second buffer layer 330, the gas barrier layer 340, or the external light extraction pattern 410 may be excluded. Manufacture of an integrated substrate including a first electrode 300 and a substrate 100 may be completed through the manufacturing examples described thus far.

Figure 8A:
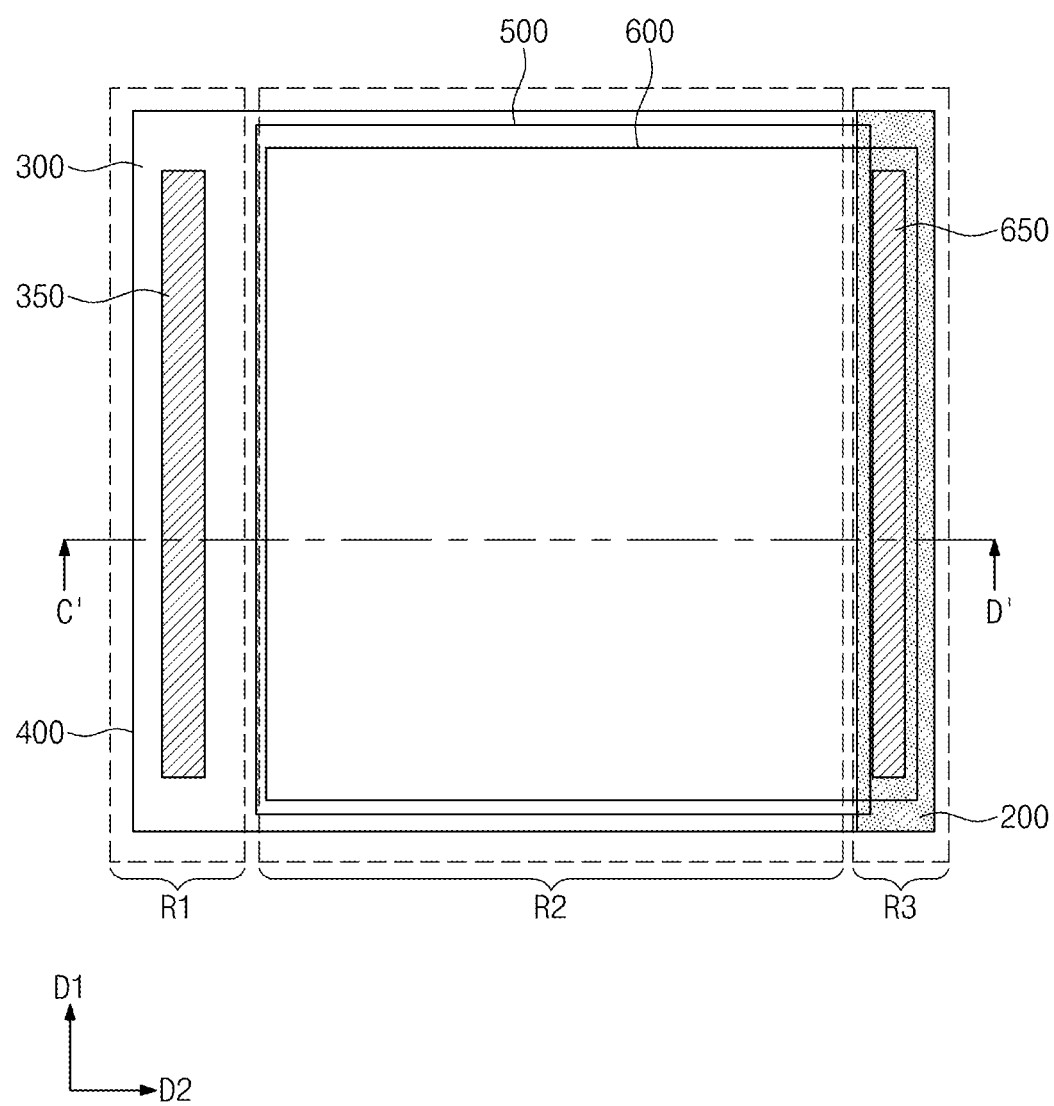
FIG. 8A is a cross-sectional view illustrating an organic light emitting diode according to other embodiments.
Figure 8B:
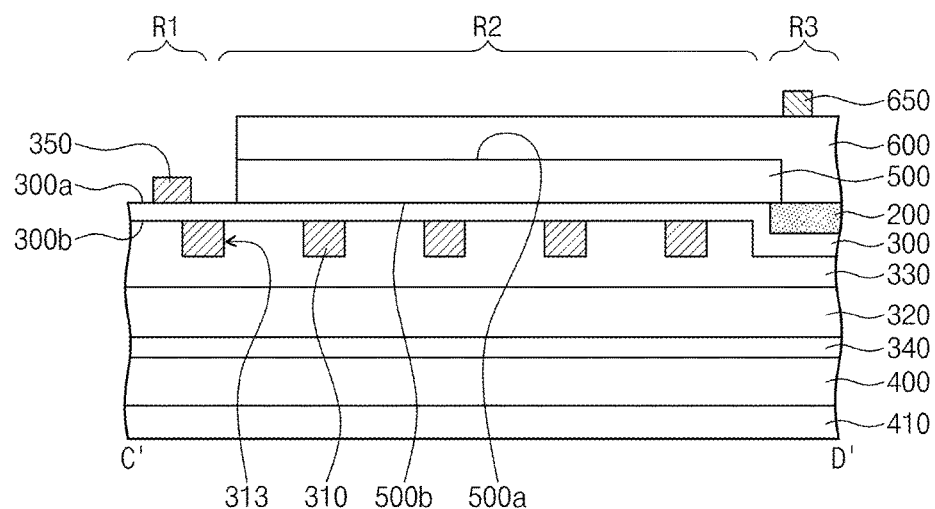
FIG. 8B is a cross section along line C'-D' in FIG. 8A.

FIG. 8A is a cross-sectional view illustrating an organic light emitting diode according to other embodiments. FIG. 8B is a cross section along line C'-D' in FIG. 8A. Hereinafter, descriptions already given above will not be repeated.

Referring to FIGS. 8A and 8B, an organic light emitting diode 2 may include a substrate 400, an external light extraction pattern 410, a gas barrier layer 340, a first buffer layer 320, a second buffer layer 330, an auxiliary electrode pattern 310, an insulating pattern 200, a first electrode 300, an organic light emitting layer 500, a second electrode 600, a first electrode pad 350, and a second electrode pad 650. The substrate 400, the external light extraction pattern 410, the gas barrier layer 340, the first buffer layer 320, the second buffer layer 330, the auxiliary electrode pattern 310, the insulating pattern 200, and the first electrode 300 may be manufactured as illustrated in FIGS. 5A to 5C. A first surface 300a of the first electrode 300 may be exposed on a first region R1 and a second region R2 by the insulating pattern 200. The first electrode 300 may be covered in a third region R3 by the insulating pattern 200. The organic light emitting layer 500 and the second electrode 600 may be disposed on the first electrode 300. The first electrode pad 350 and the second electrode pad 650 may be respectively disposed on the first electrode 300 and the second electrode 600.

According to an embodiment, the organic light emitting diode 2 may include the second buffer layer 330 and the external light extraction pattern 410, and thereby the light extraction efficiency of the organic light emitting diode 2 may be improved. The second buffer layer 330 may be the same as in the example of FIGS. 6A and 6B, and the external light extraction pattern 410 may be the same as in one of the examples of FIGS. 7A to 7D. The gas barrier layer 340 may prevent external oxygen and/or moisture from being introduced into the first electrode 300. Consequently, the durability of the organic light emitting diode 2 may be improved. In another example, the gas barrier layer 340 may be excluded and the second buffer layer 330 may prevent the introduction of external oxygen and/or moisture. In another example, at least one of the second buffer layer 330, the gas barrier layer 340, or the external light extraction pattern 410 may be excluded, but an embodiment of the inventive concept is not limited thereto.

Figure 9A:
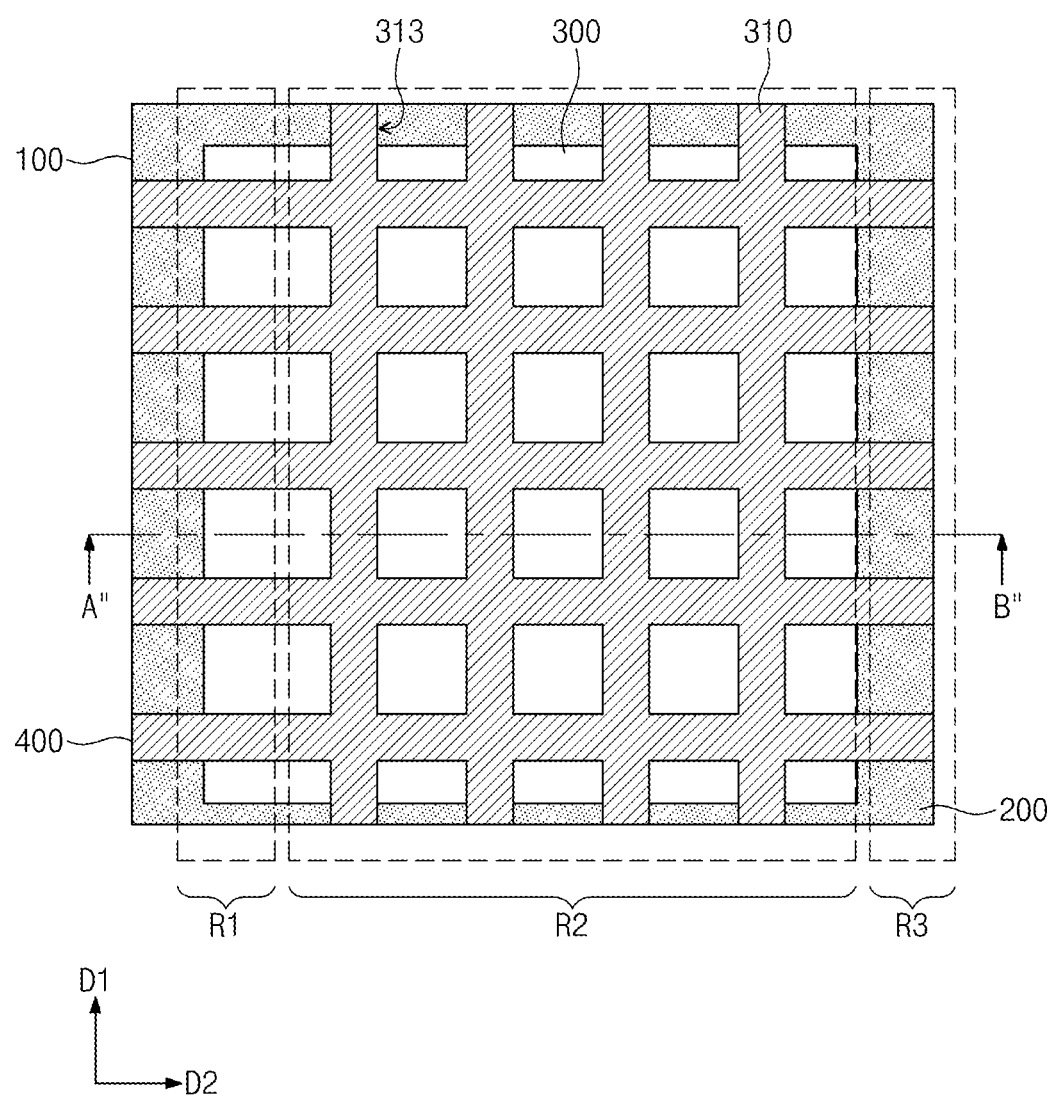
FIG. 9A is a plan view illustrating a first electrode according to still other embodiments.
Figure 9B:
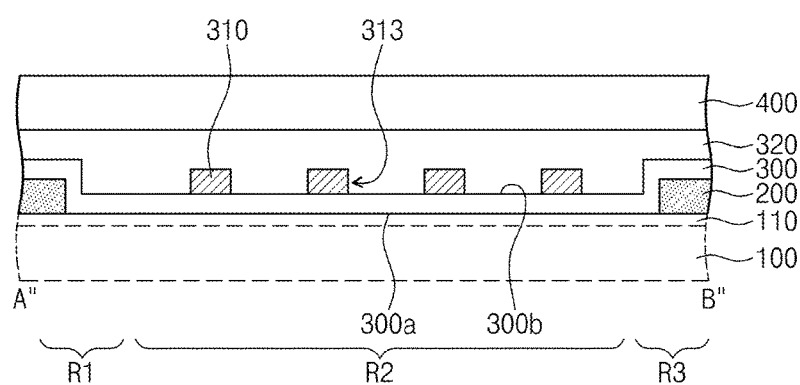
FIG. 9B corresponds to a cross section along line A"-B" in FIG. 9A.

FIG. 9A is a plan view illustrating a first electrode according to still other embodiments. FIG. 9B corresponds to a cross section along line A"-B" in FIG. 9A.

Referring to FIGS. 9A and 9B, an insulating pattern 200 may be provided on a sacrificial layer 110. As in FIG. 9A, the insulating pattern 200 may include portions extending along a first direction D1 and portions extending along a second direction D2. The insulating pattern 200 may overlap a third region R3 of a substrate 400. The shape of the insulating pattern 200 when viewed on a plane is not limited to that shown, and may be varied. The first electrode 300, the auxiliary electrode pattern 310, the first buffer layer 320, and the substrate 400 may be formed on the sacrificial layer 110 and the insulating pattern 200 in the same manner as illustrated in FIG. 1E. Although not shown, an auxiliary sacrificial layer 105, a second buffer layer 330, a gas barrier layer 340, or an external light extraction pattern 410 may be further formed as in FIG. 5C. A release substrate 100 and the sacrificial layer 110 may be removed to expose a first surface 300a of the first electrode 300 and the insulating pattern 200.

Figure 10A:
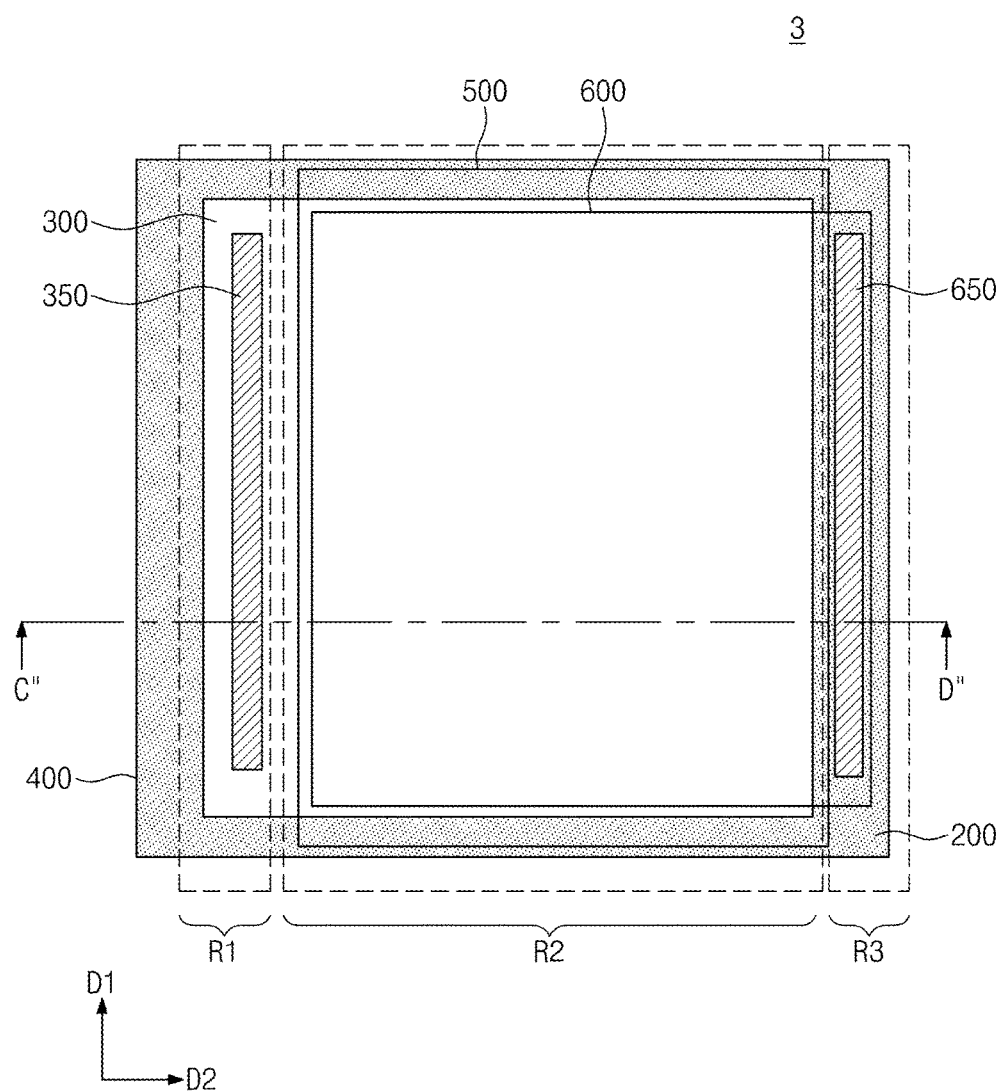
FIG. 10A is a plan view illustrating an organic light emitting diode according to still other embodiments.
Figure 10B:
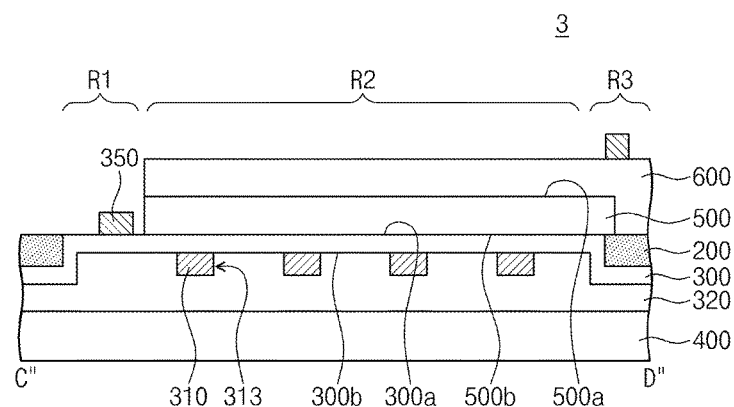
FIG. 10B is a cross section along line C"-D" in FIG. 10A.

FIG. 10A is a plan view illustrating an organic light emitting diode according to still other embodiments. FIG. 10B is a cross section along line C"-D" in FIG. 10A.

Referring to FIGS. 10A and 10B, an organic light emitting diode 3 may include a substrate 400, a first buffer layer 320, an auxiliary electrode pattern 310, a first electrode 300, an insulating pattern 200, an organic light emitting layer 500, a second electrode 600, a first electrode pad 350, and a second electrode pad 650. The substrate 400, the first buffer layer 320, the auxiliary electrode pattern 310, the insulating pattern 200, the first electrode 300, and the insulating pattern 200 may be the same as illustrated in FIGS. 9A and 9B. As in FIG. 10B, a first surface 300a of the first electrode 300 may be exposed in a first region R1 and a second region R2 by the insulating pattern 200.

On a second region R2 of the substrate 400, the organic light emitting layer 500 may cover the first electrode 300. On a first region R1 of the substrate 400, the organic light emitting layer 500 may expose the first electrode 300. On a third region R3 of the substrate 400, the organic light emitting layer 500 may expose the insulating pattern 200. In the second region R2 of the substrate 400, the second electrode 600 may be disposed on the organic light emitting layer 500. In the first region R1 of the substrate 400, the second electrode 600 may be excluded. In the third region R3 of the substrate 400, the second electrode 600 may cover the insulating pattern 200.

The first electrode pad 350 may be disposed on the first electrode 300. The second electrode pad 650 may be disposed on the second electrode 600. Referring to FIG. 10A, when viewed on a plane, the second electrode pad 650 may overlap with the insulating pattern 200. Manufacture of an integrated substrate including the first electrode 300 and the substrate 100 may be completed through the manufacturing examples described thus far.

Figure 11A:
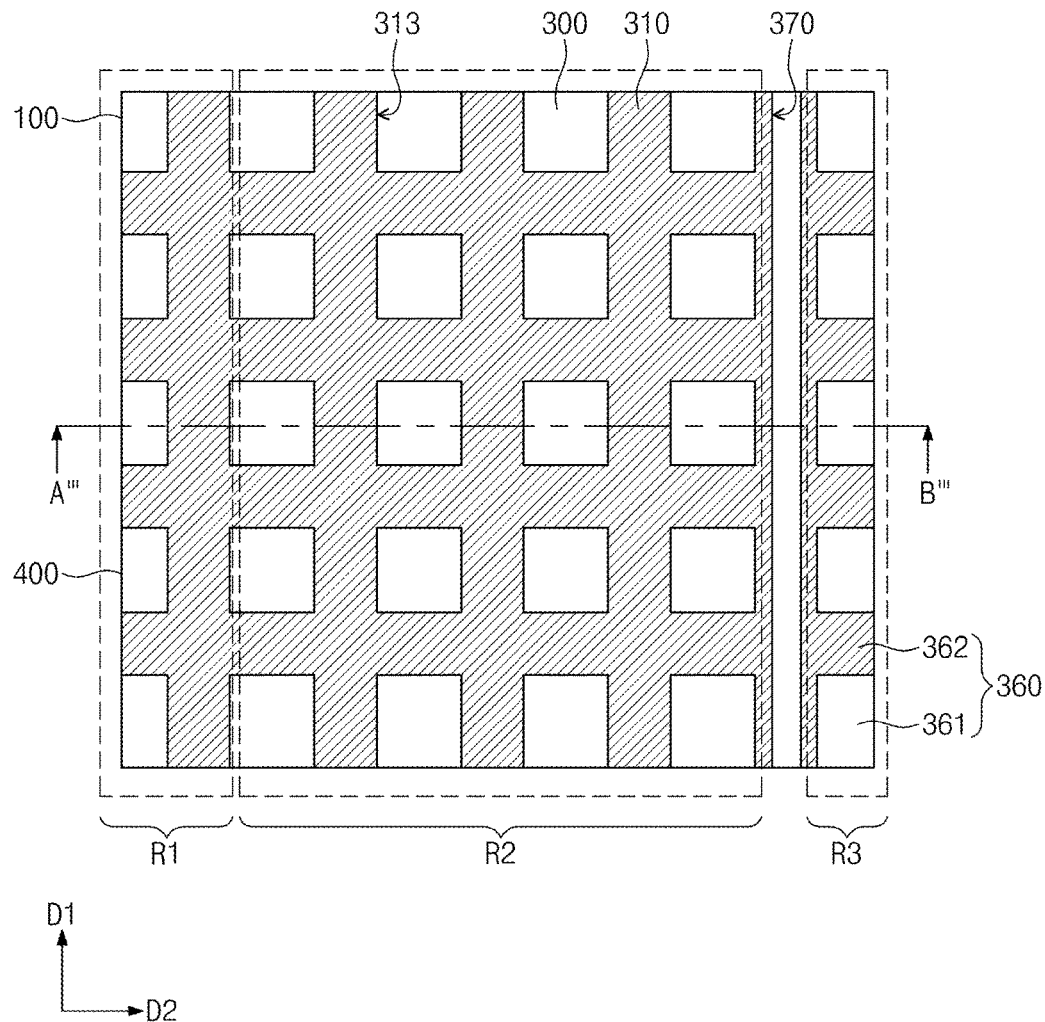
FIG. 11A is a plan view illustrating a first electrode according to still other embodiments.
Figure 11B:
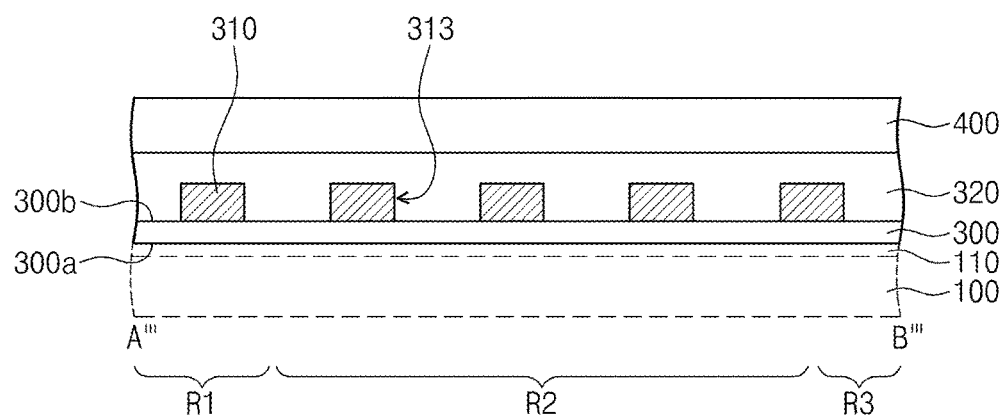
FIGS. 11B and 11C are cross-sectional views for illustrating a method for manufacturing a first electrode according to still other embodiments.
Figure 11C:
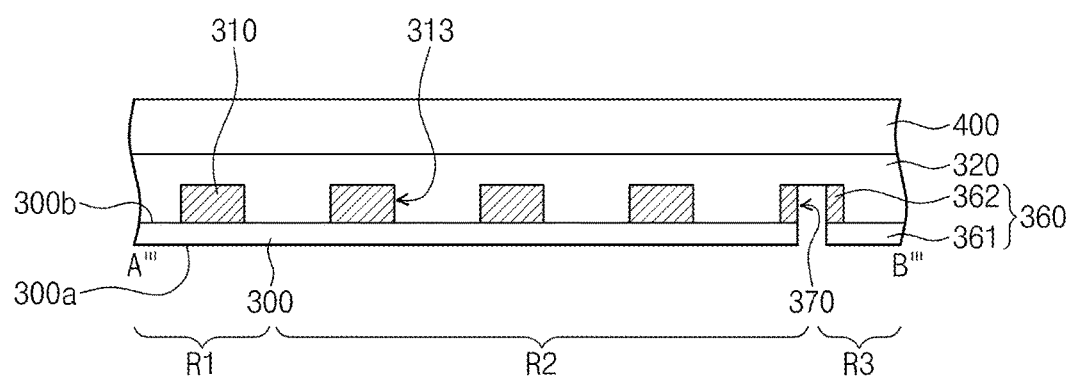

FIG. 11A is a plan view illustrating a first electrode according to still other embodiments. FIGS. 11B and 11C are cross-sectional views for illustrating a method for manufacturing a first electrode according to still other embodiments, and correspond to a cross section along line A'"-B'" in FIG. 11A. Hereinafter, descriptions already given above will not be repeated.

Referring to FIGS. 11A and 11B, a sacrificial layer 110, a first electrode 300, an auxiliary electrode pattern 310, a first buffer layer 320, and a substrate 400 may be formed on a release substrate 100. However, an insulating pattern 200 may be excluded. Although not shown, an auxiliary sacrificial layer 105, a second buffer layer 330, a gas barrier layer 340, or an external light extraction pattern 410 in FIG. 5C may also be formed. The release substrate 100 and the sacrificial layer 110 may be removed to expose a first surface 300a of the first electrode 300.

Referring to FIGS. 11A and 11C, the first electrode 300 and the auxiliary electrode pattern 310 may be patterned by a laser to form a groove 370 exposing the first buffer layer 320. The groove 370 may cause a pad portion 360 to be separated from the first electrode 300 and the auxiliary electrode pattern 310. The pad portion 360 may be formed on one side of the first electrode 300 and the auxiliary electrode pattern 310. The pad portion 360 may include a first pad portion 361 and a second pad portion 362. The first pad portion 361 may contain the same material as the first electrode 300 and be disposed, spaced apart, next to the first electrode 300. The second pad portion 362 may contain the same material as the auxiliary electrode pattern 310 and be disposed, spaced apart, next to the auxiliary electrode 310. The first pad portion 361 and the second pad portion 362 may be electrically isolated from the first electrode 300 and the auxiliary electrode pattern 310. As in FIG. 11, the groove 370 may be provided between a second region R2 of the substrate 400 and a third region R3 of the substrate 400. When viewed on a plane, the pad portion 360 may overlap with the third region R3 of the substrate 400.

Figure 12A:
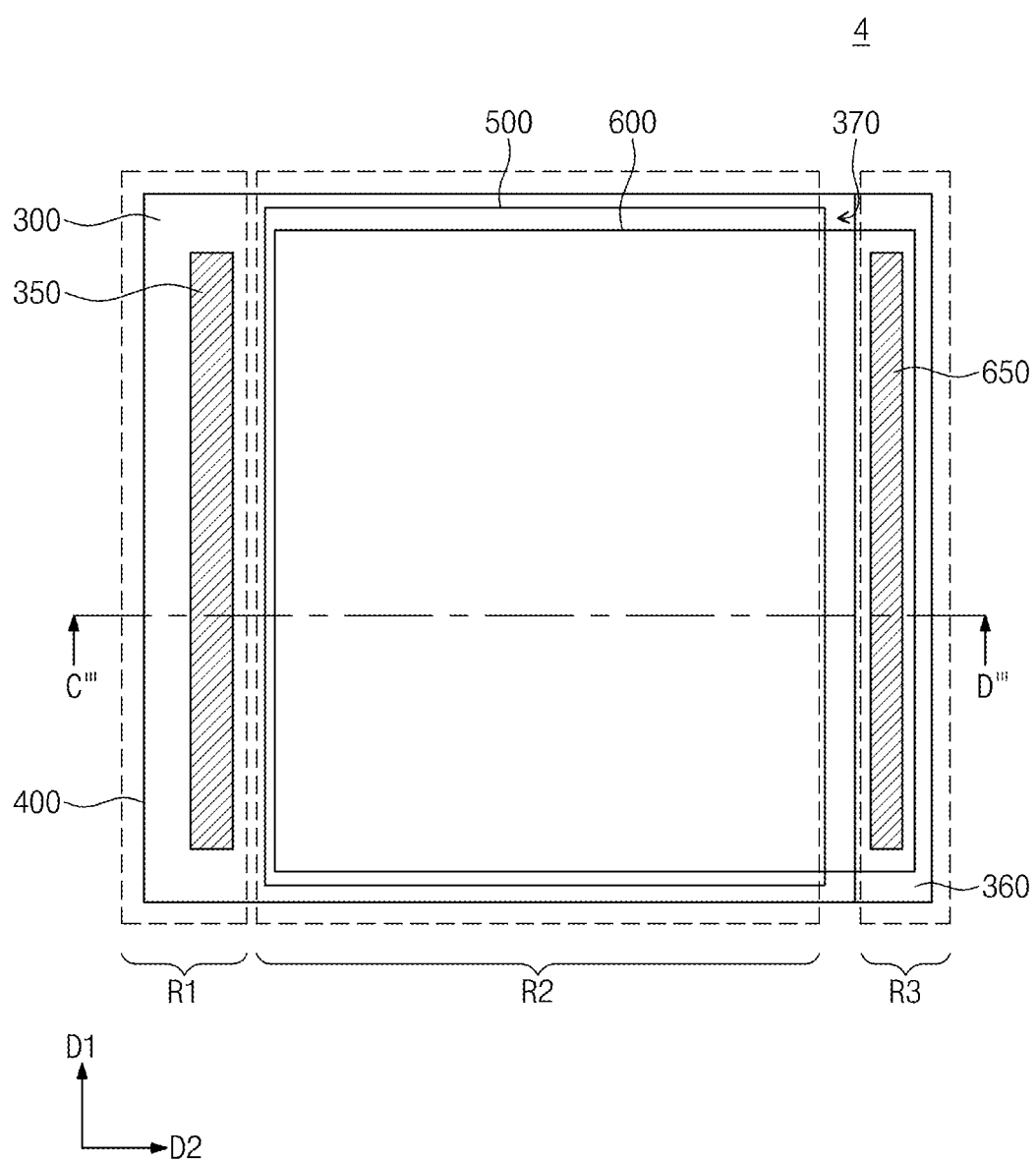
FIG. 12A is a plan view illustrating an organic light emitting diode according to still other embodiments.
Figure 12B:
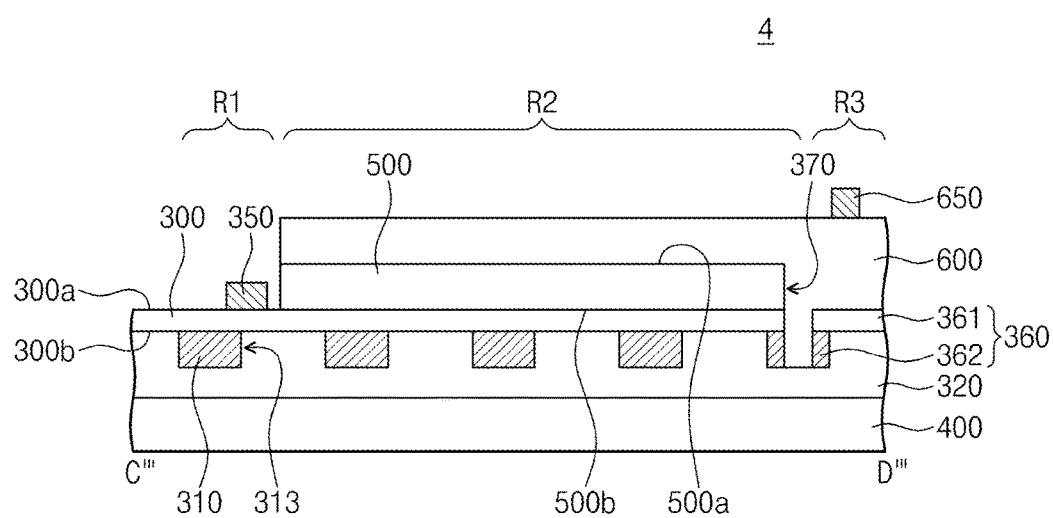
FIG. 12B is a cross section along line C"-D" in FIG. 12A.

FIG. 12A is a plan view illustrating an organic light emitting diode according to still other embodiments. FIG. 12B is a cross section along line C'"-D'" in FIG. 12B.

Referring to FIGS. 12A and 12B, an organic light emitting diode 4 may include a substrate 400, a first buffer layer 320, an auxiliary electrode pattern 310, a first electrode 300, a pad portion 360, an organic light emitting layer 500, a second electrode 600, a first electrode pad 350, and a second electrode pad 650. The substrate 400, the first buffer layer 320, the auxiliary electrode pattern 310, the first electrode 300, and the pad portion 360 may be manufactured as illustrated in FIGS. 11A to 11C.

On a second region R2 of the substrate 400, the organic light emitting layer 500 may cover the first electrode. On a first region R1 of the substrate 400, the organic light emitting layer 500 may expose the first electrode 300. The first electrode pad 350 may be disposed on the first electrode 300 exposed by the organic light emitting layer 500.

In the second region R2 of the substrate 400, the second electrode 600 may be disposed on the organic light emitting layer 500. The second electrode 600 may extend to the third region R3 of the substrate and cover the pad portion 360. The second electrode pad 650 may be provided on the second electrode 600. Referring to FIG. 12A, when viewed on a plane, the second electrode pad 650 may overlap the third region R3 of the substrate 400. A groove 370 and the pad portion 360 may be provided such that the second electrode pad 650 is spaced apart from the first electrode 300. Consequently, the occurrence of an electrical short between the first electrode 300 and the second electrode 600 may be prevented.

According to an embodiment of the inventive concept, a first electrode may be manufactured using a release substrate to have a flat first surface. An organic light emitting diode manufactured using the first electrode may exhibit improved stability and reliability. An auxiliary electrode pattern may have a lower resistance than the first electrode. Consequently, an IR drop effect in the first electrode may be prevented such that the organic light emitting diode achieves a uniform luminescent brightness.

An opening in an auxiliary electrode pattern may be formed without additional photolithography and etching operations. A buffer layer uses a precursor solution, and thus the opening may be filled without an additional patterning operation. Consequently, manufacture of the auxiliary electrode pattern and the buffer layer may be simplified.

A sacrificial layer may be provided to enable a release film to be easily separated from a first electrode.

What is claimed is:

1. A method for manufacturing an organic light emitting diode, the method comprising:

forming a sacrificial layer on a release substrate;

forming an insulating pattern on the sacrificial layer;

forming on the sacrificial layer a first electrode having a first surface and a second surface which are facing each other, the first electrode extending onto the insulating pattern;

forming an auxiliary electrode pattern having an opening on the first electrode, wherein the opening exposing the second surface of the first electrode;

forming a buffer layer on the auxiliary electrode pattern and in the opening;

providing a substrate on the buffer layer;

removing the release substrate and the sacrificial layer to expose the first surface of the first electrode;

forming an organic light emitting layer on the first surface of the first electrode;

forming a second electrode on the organic light emitting layer; and forming a second electrode pad on the second electrode, wherein the second electrode pad overlaps the insulating pattern when viewed on a plane.

2. The method of claim 1, wherein the organic light emitting layer exposes the insulating pattern, the second electrode extending onto the insulating pattern.

3. The method of claim 1, further comprising forming a first electrode pad on the first electrode.

4. The method of claim 3, wherein:

the organic light emitting layer and the second electrode expose a portion of the first surface of the first electrode; and the first electrode pad is disposed on the portion of the first surface of the first electrode.

5. The method of claim 1, wherein the forming of the auxiliary electrode pattern is performed through a screen printing method, an offset printing method, a gravure printing method, or a nozzle printing method.

6. The method of claim 1, wherein the forming of the buffer layer comprises:

applying a precursor solution onto the auxiliary electrode pattern to form a precursor layer which fills in the opening; and curing the precursor layer.

7. The method of claim 1, wherein the substrate comprises a first region, a second region, and a third region, the first electrode and the first electrode pad overlapping the first region of the substrate, the first electrode, the organic light emitting layer, and the second electrode overlapping the second region of the substrate, and the insulating pattern, the second electrode, and the second electrode pad overlapping the third region of the substrate.

8. The method of claim 1, wherein the buffer layer comprises:

a first buffer layer covering the auxiliary electrode pattern and including a light extraction layer; and a second buffer layer provided between the first buffer layer and the substrate.

* * * * *